(12) United States Patent
Katoh et al.

(10) Patent No.: US 10,073,314 B2
(45) Date of Patent: Sep. 11, 2018

(54) SEMICONDUCTOR DEVICE, LIQUID CRYSTAL DISPLAY DEVICE, AND SEMICONDUCTOR DEVICE MANUFACTURING METHOD

(71) Applicant: Sharp Kabushiki Kaisha, Sakai, Osaka (JP)

(72) Inventors: Sumio Katoh, Sakai (JP); Naoki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/509,526

(22) PCT Filed: Aug. 31, 2015

(86) PCT No.: PCT/JP2015/074719
§ 371 (c)(1),
(2) Date: Apr. 26, 2017

(87) PCT Pub. No.: WO2016/039211
PCT Pub. Date: Mar. 17, 2016

(65) Prior Publication Data
US 2017/0235173 A1 Aug. 17, 2017

(30) Foreign Application Priority Data
Sep. 10, 2014 (JP) .................. 2014-184460

(51) Int. Cl.
*G02F 1/1368* (2006.01)
*G02F 1/1362* (2006.01)
(Continued)

(52) U.S. Cl.
CPC ........ *G02F 1/1368* (2013.01); *G02F 1/13439* (2013.01); *G02F 1/134309* (2013.01);
(Continued)

(58) Field of Classification Search
CPC .......... G02F 1/13; G02F 1/136; G02F 1/1368; G02F 1/1362; G02F 1/136227;
(Continued)

(56) References Cited

U.S. PATENT DOCUMENTS 6,219,114 B1\* 4/2001 Lyu .................. G02F 1/1368
349/139
2006/0194500 A1 8/2006 Ishii
(Continued)

FOREIGN PATENT DOCUMENTS

JP 2006-245031 A 9/2006
JP 2008-116502 A 5/2008
(Continued)

*Primary Examiner* — Thoi Duong
(74) *Attorney, Agent, or Firm* — Keating & Bennett, LLP

(57) ABSTRACT

A semiconductor device includes: a first metal layer including a gate electrode; a first insulating layer provided on the first metal layer; an oxide semiconductor layer provided on the first insulating layer; a second insulating layer provided on the oxide semiconductor layer; a second metal layer provided on the oxide semiconductor layer and the second insulating layer, the second metal layer including a source electrode; a third insulating layer provided on the second metal layer; and a first transparent electrode layer provided on the third insulating layer. The oxide semiconductor layer includes a first portion lying above the gate electrode and a second portion extending from the first portion so as to lie across an edge of the gate electrode on the drain electrode side. The third insulating layer does not include an organic insulating layer. The second insulating layer and the third insulating layer have a first contact hole which overlaps the second portion of the oxide semiconductor layer when viewed in a normal direction of the substrate. The first transparent electrode layer includes a transparent electrically-conductive layer which is in contact with the second
(Continued)

portion of the oxide semiconductor layer in the first contact hole.

18 Claims, 17 Drawing Sheets

(51) Int. Cl.
　　*G02F 1/1343* (2006.01)
　　*H01L 27/12* (2006.01)
　　*H01L 29/786* (2006.01)
(52) U.S. Cl.
　　CPC .. *G02F 1/136227* (2013.01); *G02F 1/136286* (2013.01); *H01L 27/1225* (2013.01); *H01L 27/1248* (2013.01); *H01L 29/7869* (2013.01); *G02F 2001/134372* (2013.01); *G02F 2001/136218* (2013.01); *G02F 2201/121* (2013.01); *G02F 2201/123* (2013.01); *G02F 2202/10* (2013.01)
(58) Field of Classification Search
　　CPC ......... G02F 1/136286; G02F 1/134309; G02F 1/134363; G02F 1/133345; G02F 1/134336; G02F 1/133512; G02F 1/1333; G02F 1/133707; G02F 1/1343; G02F 2001/136295; G02F 2001/133357; G02F 2001/134318; G02F 2201/123; G02F 2201/50; G02F 2202/10; H01L 29/7869; H01L 29/41733; H01L 29/45; H01L 29/78696; H01L 29/78648; H01L 29/42356; H01L 29/4908; H01L 29/786; H01L 29/458; H01L 29/66765; H01L 29/78669; H01L 29/78678; H01L 29/401; H01L 27/1259; H01L 27/127; H01L 27/3248; H01L 27/3244; H01L 27/326; H01L 21/441; H01L 21/02565; H01L 21/44; H01L 21/47573; H01L 21/475; H01L 21/76834; H01L 21/02164; H01L 21/28; H01L 28/60; G06F 3/0412; G09G 2300/0426; G09G 3/3648
　　See application file for complete search history.

(56) References Cited

U.S. PATENT DOCUMENTS

| | | | |
|---|---|---|---|
| 2008/0136990 | A1 | 6/2008 | Kimura |
| 2010/0200851 | A1 | 8/2010 | Oikawa et al. |
| 2012/0052625 | A1* | 3/2012 | Yamazaki ........... H01L 27/1214 |
| | | | 438/104 |
| 2012/0138922 | A1 | 6/2012 | Yamazaki et al. |
| 2013/0120701 | A1 | 5/2013 | Yamazaki et al. |
| 2013/0201420 | A1 | 8/2013 | Misaki |
| 2013/0208205 | A1 | 8/2013 | Misaki |
| 2014/0191238 | A1 | 7/2014 | Hwang et al. |
| 2014/0340607 | A1 | 11/2014 | Nakata et al. |

FOREIGN PATENT DOCUMENTS

| | | |
|---|---|---|
| JP | 2010-206187 A | 9/2010 |
| JP | 2012-134475 A | 7/2012 |
| JP | 2013-105136 A | 5/2013 |
| JP | 2013-123039 A | 6/2013 |
| JP | 2014-132337 A | 7/2014 |
| JP | 2014-142621 A | 8/2014 |
| WO | 2012/017584 A1 | 2/2012 |
| WO | 2012/020525 A1 | 2/2012 |
| WO | 2013/073635 A1 | 5/2013 |

* cited by examiner (a)

(b)

(c)

SEMICONDUCTOR DEVICE, LIQUID CRYSTAL DISPLAY DEVICE, AND SEMICONDUCTOR DEVICE MANUFACTURING METHOD

TECHNICAL FIELD

The present invention relates to a semiconductor device and particularly to a semiconductor device which includes a thin film transistor which includes an oxide semiconductor layer. The present invention also relates to a liquid crystal display device which includes such a semiconductor device and a manufacturing method of such a semiconductor device.

BACKGROUND ART

Recently, a liquid crystal display device which includes an active matrix substrate has been applied to various uses. The active matrix substrate includes a switching element in each pixel. An active matrix substrate which includes a thin film transistor (TFT) as a switching element is referred to as "TFT substrate".

The TFT substrate includes a TFT and a pixel electrode provided in each pixel, a gate wire for supplying a gate signal to the TFT, a source wire for supplying a source signal to the TFT. The gate electrode, the source electrode and the drain electrode of the TFT are electrically coupled with the gate wire, the source wire and the pixel electrode, respectively. The TFT, the gate wire and the source wire are covered with an interlayer insulating layer. The pixel electrode is provided on the interlayer insulating layer and is coupled with the drain electrode of the TFT in a contact hole formed in the interlayer insulating layer.

As the interlayer insulating layer, an insulating layer which is made of an organic insulating material (hereinafter, referred to as "organic insulating layer") is sometimes used. For example, Patent Documents 1 and 2 disclose a TFT substrate which includes an inorganic insulating layer and an organic insulating layer provided on the inorganic insulating layer as interlayer insulating layers covering TFTs and wires.

Organic insulating materials have lower dielectric constants than inorganic insulating materials and are likely to be deposited to a greater thickness. If an interlayer insulating layer which includes a relatively-thick organic insulating layer (e.g., having a thickness of about 1 μm to 3 μm) is formed, when the pixel electrode is arranged such that part of the pixel electrode extends over the gate wire and/or source wire with the interlayer insulating layer interposed therebetween, the parasitic capacitance formed between the pixel electrode and the gate wire and/or source wire can be reduced. Therefore, the pixel electrode can be arranged such that part of the pixel electrode extends over the gate wire and/or source wire and, thus, the pixel aperture ratio can be improved.

CITATION LIST

Patent Literature

Patent Document 1: Japanese Laid-Open Patent Publication No. 2013-105136
Patent Document 2: WO 2013/073635

SUMMARY OF INVENTION

Technical Problem

However, when a thick organic insulating layer is formed, a contact hole which is formed in the interlayer insulating layer for connection between the drain electrode and the pixel electrode is deep. If the contact hole is deep, there is a probability that the state of alignment of liquid crystal molecules near the contact hole is disturbed so that light leakage can occur. Since the contact hole formed in the organic insulating layer has a tapered shape, the area of the opening of the contact hole increases as the depth of the contact hole increases.

In Patent Document 1, in order to suppress light leakage near the contact hole, the contact hole is provided above the drain electrode such that the drain electrode (or an extended part of the drain electrode) shields a region near the contact hole from light. In Patent Document 2, the contact hole is provided above the gate electrode (gate wire) such that a region near the contact hole is shielded from light. However, in order to shield a region near the contact hole from light, it is necessary to form a sufficiently large shielded region in consideration of alignment errors in the manufacture process. Therefore, when employing a configuration which shields a region near the contact hole from light, such as the configurations of Patent Documents 1 and 2, a region of a pixel which contributes to displaying decreases by the amount of the shielded region, so that the light utilization efficiency decreases.

In recent years, display devices have increasingly higher definitions, and display devices of higher definitions have smaller pixel areas. Decrease of the light utilization efficiency which is attributed to formation of a shielded region in pixels is more significant.

The present invention was conceived in view of the above-described problems. One of the objects of the present invention is to provide a semiconductor device in which decrease of the light utilization efficiency is suppressed than in conventional semiconductor devices and a manufacturing method of the semiconductor device.

Solution to Problem

A semiconductor device according to an embodiment of the present invention is a semiconductor device including a substrate and a thin film transistor supported by the substrate, the thin film transistor including a gate electrode, a source electrode and a drain electrode, the semiconductor device including: a first metal layer including the gate electrode of the thin film transistor; a first insulating layer provided on the first metal layer; an oxide semiconductor layer provided on the first insulating layer, the oxide semiconductor layer including an active layer of the thin film transistor; a second insulating layer provided on the oxide semiconductor layer, the second insulating layer including a portion covering a channel region of the oxide semiconductor layer; a second metal layer provided on the oxide semiconductor layer and the second insulating layer, the second metal layer including at least the source electrode; a third insulating layer provided on the second metal layer; and a first transparent electrode layer provided on the third insulating layer, wherein the oxide semiconductor layer includes a first portion lying above the gate electrode and a second portion extending from the first portion so as to lie across an edge of the gate electrode on the drain electrode side, the third insulating layer does not include an organic insulating layer, the second insulating layer and the third insulating layer have a first contact hole which overlaps the second portion of the oxide semiconductor layer when viewed in a normal direction of the substrate, and the first transparent electrode layer includes a transparent electrically-conductive layer which is in contact with the second portion of the oxide semiconductor layer in the first contact hole.

A semiconductor device according to another embodiment of the present invention is a semiconductor device including a substrate and a thin film transistor supported by the substrate, the thin film transistor including a gate electrode, a source electrode and a drain electrode, the semiconductor device including: an oxide semiconductor layer including an active layer of the thin film transistor; a first insulating layer provided on the oxide semiconductor layer; a first metal layer provided on the first insulating layer, the first metal layer including the gate electrode of the thin film transistor; a second insulating layer provided on the first metal layer; a second metal layer provided on the second insulating layer, the second metal layer including at least the source electrode; a third insulating layer provided on the second metal layer; and a first transparent electrode layer provided on the third insulating layer, wherein the oxide semiconductor layer includes a first portion lying above the gate electrode and a second portion extending from the first portion so as to lie across an edge of the gate electrode on the drain electrode side, the third insulating layer does not include an organic insulating layer, the first insulating layer, the second insulating layer and the third insulating layer have a first contact hole which overlaps the second portion of the oxide semiconductor layer when viewed in a normal direction of the substrate, and the first transparent electrode layer includes a transparent electrically-conductive layer which is in contact with the second portion of the oxide semiconductor layer in the first contact hole.

In one embodiment, the second metal layer further includes the drain electrode, and the first contact hole also overlaps an end portion of the drain electrode on the second portion side when viewed in the normal direction of the substrate.

In one embodiment, the second metal layer does not include the drain electrode.

In one embodiment, the semiconductor device of the present invention includes a plurality of pixels, each of the plurality of pixels includes the thin film transistor and the transparent electrically-conductive layer, and the transparent electrically-conductive layer functions as a pixel electrode.

In one embodiment, the semiconductor device of the present invention further includes: a fourth insulating layer covering the first transparent electrode layer; and a second transparent electrode layer provided on the fourth insulating layer, wherein the second transparent electrode layer includes a transparent electrode which is electrically separated from the pixel electrode, the transparent electrode being capable of functioning as a common electrode.

In one embodiment, the second metal layer further includes an upper wire layer, the third insulating layer and the fourth insulating layer have a second contact hole which overlaps the upper wire layer when viewed in the normal direction of the substrate, the second transparent electrode layer further includes a transparent connecting layer which is electrically coupled with the common electrode, and the transparent connecting layer is in contact with the upper wire layer in the second contact hole.

In one embodiment, the second metal layer includes an upper wire layer, the third insulating layer and the fourth insulating layer have a second contact hole which overlaps the upper wire layer when viewed in the normal direction of the substrate, the first transparent electrode layer further includes a first transparent connecting layer which is electrically separated from the pixel electrode, the second transparent electrode layer further includes a second transparent connecting layer which is electrically coupled with the common electrode, the first transparent connecting layer is in contact with the upper wire layer in the second contact hole, and the second transparent connecting layer is in contact with the first transparent connecting layer in the second contact hole.

In one embodiment, the semiconductor device of the present invention further includes: a fourth insulating layer provided between the third insulating layer and the first transparent electrode layer, and a second transparent electrode layer provided between the third insulating layer and the fourth insulating layer, wherein the first contact hole is provided also in the fourth insulating layer, and the second transparent electrode layer includes a transparent electrode which is electrically separated from the pixel electrode, the transparent electrode being capable of functioning as a common electrode.

In one embodiment, the semiconductor device of the present invention further includes: a fourth insulating layer provided on the first transparent electrode layer; and a second transparent electrode layer provided on the fourth insulating layer, wherein the first contact hole is also provided in the fourth insulating layer, the first transparent electrode layer further includes a first electrode which is electrically separated from the transparent electrically-conductive layer, and the second transparent electrode layer includes a second electrode which is in contact with the transparent electrically-conductive layer in the first contact hole.

In one embodiment, the semiconductor device of the present invention includes a plurality of pixels, each of the plurality of pixels includes the thin film transistor, the first electrode and the second electrode, the first electrode functions as a common electrode, and the second electrode functions as a pixel electrode.

In one embodiment, the oxide semiconductor layer includes an In—Ga—Zn—O based semiconductor.

In one embodiment, the In—Ga—Zn—O based semiconductor includes a crystalline portion.

A liquid crystal display device according to an embodiment of the present invention is a display device which includes: an active matrix substrate; a counter substrate which opposes the active matrix substrate; and a liquid crystal layer provided between the active matrix substrate and the counter substrate, wherein the active matrix substrate is a semiconductor device which has the above-described configuration.

A manufacturing method of a semiconductor device according to an embodiment of the present invention, the semiconductor device including a substrate and a thin film transistor supported by the substrate, the thin film transistor including a gate electrode, a source electrode and a drain electrode, includes the steps of: (a) forming a first metal layer on the substrate, the first metal layer including the gate electrode of the thin film transistor; (b) forming a first insulating layer on the first metal layer; (c) forming an oxide semiconductor layer on the first insulating layer; (d) forming a second insulating layer on the oxide semiconductor layer, the second insulating layer including a portion covering a channel region of the oxide semiconductor layer; (e) forming a second metal layer on the oxide semiconductor layer and the second insulating layer, the second metal layer including at least the source electrode; (f) forming a third insulating layer on the second metal layer; (g) forming a contact hole in the second insulating layer and the third insulating layer; and (h) after step (g), forming a transparent electrode layer on the third insulating layer, wherein the oxide semiconductor layer formed in step (c) includes a first portion lying above the gate electrode and a second portion extending from the first portion so as to lie across an edge of the gate electrode on the drain electrode side, the third insulating layer formed in step (f) does not include an organic insulating layer, the contact hole formed in step (g) overlaps the second portion of the oxide semiconductor layer when viewed in a normal direction of the substrate, and the transparent electrode layer formed in step (h) includes a transparent electrically-conductive layer which is in contact with the second portion of the oxide semiconductor layer in the contact hole.

A manufacturing method of a semiconductor device according to another embodiment of the present invention, the semiconductor device including a substrate and a thin film transistor supported by the substrate, the thin film transistor including a gate electrode, a source electrode and a drain electrode, includes the steps of: (a) forming an oxide semiconductor layer on the substrate, the oxide semiconductor layer including an active layer of the thin film transistor; (b) forming a first insulating layer on the oxide semiconductor layer; (c) forming a first metal layer on the first insulating layer, the first metal layer including the gate electrode of the thin film transistor; (d) forming a second insulating layer on the first metal layer; (e) forming a second metal layer on the second insulating layer, the second metal layer including at least the source electrode; (f) forming a third insulating layer on the second metal layer; (g) forming a contact hole in the first insulating layer, the second insulating layer and the third insulating layer; and (h) after step (g), forming a transparent electrode layer on the third insulating layer, wherein the oxide semiconductor layer formed in step (a) includes a first portion lying above the gate electrode and a second portion extending from the first portion so as to lie across an edge of the gate electrode on the drain electrode side, the third insulating layer formed in step (f) does not include an organic insulating layer, the contact hole formed in step (g) overlaps the second portion of the oxide semiconductor layer when viewed in a normal direction of the substrate, and the transparent electrode layer formed in step (h) includes a transparent electrically-conductive layer which is in contact with the second portion of the oxide semiconductor layer in the contact hole.

In one embodiment, the second metal layer formed in step (e) further includes the drain electrode, and the contact hole formed in step (g) also overlaps an end portion of the drain electrode on the second portion side when viewed in the normal direction of the substrate.

In one embodiment, the second metal layer formed in step (e) does not include the drain electrode.

In one embodiment, the oxide semiconductor layer includes an In—Ga—Zn—O based semiconductor.

In one embodiment, the In—Ga—Zn—O based semiconductor includes a crystalline portion.

Advantageous Effects of Invention

According to an embodiment of the present invention, a semiconductor device in which decrease of the light utilization efficiency is suppressed than in conventional semiconductor devices and a manufacturing method of the semiconductor device are provided.

DESCRIPTION OF EMBODIMENTS

Hereinafter, embodiments of the present invention will be described with reference to the drawings. Note that the present invention is not limited to the embodiments described below. In the following sections, a TFT substrate (active matrix substrate) for liquid crystal display devices is illustrated as a semiconductor device of an embodiment of the present invention. However, the semiconductor device of an embodiment of the present invention may be a TFT substrate for use in other types of display devices (for example, electrophoretic display devices, MEMS (Micro Electro Mechanical System) display devices, etc.).

Embodiment 1

Figure 1:
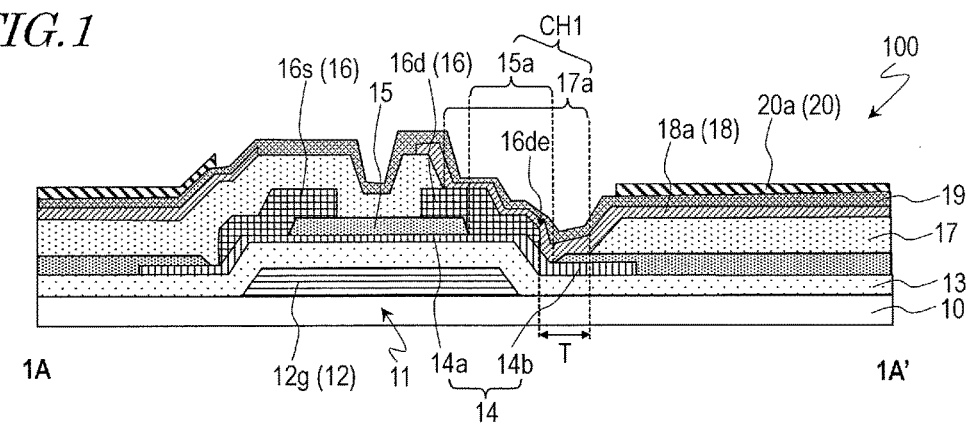
[FIG. 1] A cross-sectional view schematically showing a TFT substrate 100 of an embodiment of the present invention. This view illustrates a cross-sectional configuration taken along line 1A-1A' of FIG. 2.
Figure 2:
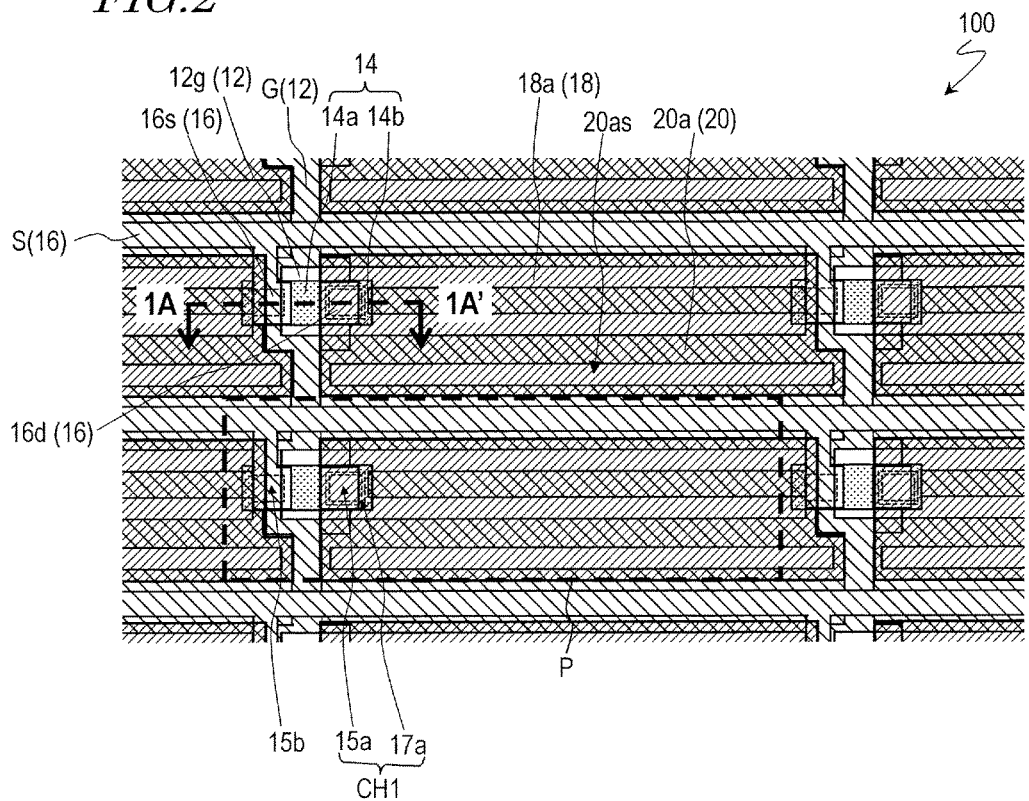
[FIG. 2] A plan view schematically showing the TFT substrate 100 of an embodiment of the present invention.

FIG. 1 and FIG. 2 show a TFT substrate (active matrix substrate) 100 of the present embodiment. FIG. 1 and FIG. 2 are a cross-sectional view and a plan view schematically showing the TFT substrate 100. FIG. 1 shows a cross-sectional configuration taken along line 1A-1A' of FIG. 2.

The TFT substrate 100 includes a plurality of regions P which are arranged in a matrix as shown in FIG. 2. Each of these regions P corresponds to respective one of the pixels of a liquid crystal display device. In the specification of the present application, the regions P of the TFT substrate 100 corresponding to respective pixels of the liquid crystal display device are also referred to as "pixels".

As shown in FIG. 1, the TFT substrate 100 includes a substrate 10 and a thin film transistor (TFT) 11 supported by the substrate 10. The substrate 10 is an insulative transparent substrate (e.g., glass substrate). The TFT 11 includes a gate electrode 12g, a source electrode 16s and a drain electrode 16d. The gate electrode 12g is electrically coupled with a gate wire (scan line) G and supplied with a gate signal (scan signal) from the gate wire G. The source electrode 16s is electrically coupled with a source wire (signal line) S and supplied with a source signal (display signal) from the source wire S. The drain electrode 16d is electrically coupled with a pixel electrode which will be described later.

Hereinafter, the configuration of the TFT substrate 100 is described more specifically. As shown in FIG. 1, the TFT substrate 100 includes a first metal layer 12, a first insulating layer 13, an oxide semiconductor layer 14, a second insulating layer 15, a second metal layer 16, a third insulating layer 17 and a first transparent electrode layer 18. The TFT substrate 100 further includes a fourth insulating layer 19 and a second transparent electrode layer 20.

The first metal layer 12 is provided on the substrate 10. The first metal layer 12 includes the gate electrode 12g of the TFT 11 and the gate wire G. The first metal layer 12 may be a single-layer structure or may be a multilayer structure consisting of a plurality of layers. The first metal layer 12 includes at least a layer which is made of a metal material. When the first metal layer 12 is a multilayer structure, some layers may be made of a metal nitride or a metal oxide.

The first insulating layer (gate insulating layer) 13 is provided on the first metal layer 12. That is, the first insulating layer 13 is arranged so as to cover the gate electrode 12g and the gate wire G. The first insulating layer 13 is made of an inorganic insulating material.

The oxide semiconductor layer 14 is provided on the first insulating layer 13. The oxide semiconductor layer 14 includes an active layer of the TFT 11. The oxide semiconductor layer 14 includes a first portion 14a lying above the gate electrode 12g and a second portion 14b extending from the first portion 14a so as to lie across an edge of the gate electrode 12g on the drain electrode 16d side.

The second insulating layer (etch stop layer) 15 is provided on the oxide semiconductor layer 14. The second insulating layer 15 includes a portion covering the channel region of the oxide semiconductor layer 14. The second insulating layer 15 is made of an inorganic insulating material. The second insulating layer 15 functions as an etch stop in patterning an electrically-conductive film which is to be the source electrode 16s and the drain electrode 16d as will be described later.

The second metal layer 16 is provided on the oxide semiconductor layer 14 and the second insulating layer 15. The second metal layer 16 includes the source electrode 16s and the drain electrode 16d of the TFT 11 and the source wire S. The second metal layer 16 may be a single-layer structure or may be a multilayer structure consisting of a plurality of layers. The second metal layer 16 includes at least a layer which is made of a metal material. When the second metal layer 16 is a multilayer structure, some layers may be made of a metal nitride or a metal oxide. The first metal layer and the second metal layer 16, which include a metal material layer, generally have higher electrical conductivities than an electrically-conductive layer which is made of a transparent electrically-conductive material. Therefore, the width of the wire can be reduced, and they can contribute to achievement of higher definition and improvement in pixel aperture ratio.

The third insulating layer (interlayer insulating layer) 17 is provided on the second metal layer 16. The third insulating layer 17 is made of an inorganic insulating material. That is, the third insulating layer 17 does not include an organic insulating layer.

The second insulating layer 15 and the third insulating layer 17 have a first contact hole CH1. The first contact hole CH1 consists of an opening 15a formed in the second insulating layer 15 and an opening 17a formed in the third insulating layer 17. The first contact hole CH1 overlaps the second portion 14b of the oxide semiconductor layer 14 when viewed in the normal direction of the substrate 10. The first contact hole CH1 also overlaps an end portion of the drain electrode 16d on the second portion 14b side when viewed in the normal direction of the substrate 10. That is, the first contact hole CH1 is formed such that the end portion 16de of the drain electrode 16d and the second portion 14b of the oxide semiconductor layer 14 are exposed.

The first transparent electrode layer 18 is provided on the third insulating layer 17. The first transparent electrode layer 18 is made of a transparent electrically-conductive material. The first transparent electrode layer 18 includes a transparent electrically-conductive layer 18a which is in contact with the second portion 14b of the oxide semiconductor layer 14 in the first contact hole CH1. The TFT 11 and the transparent electrically-conductive layer 18a are provided in each of the pixels P (i.e., each of the pixels P includes the TFT 11 and the transparent electrically-conductive layer 18*a*). The transparent electrically-conductive layer 18*a* functions as the pixel electrode.

The fourth insulating layer (storage capacitance insulating layer) 19 covers the first transparent electrode layer 18. The fourth insulating layer 19 is made of an inorganic insulating material.

The second transparent electrode layer 20 is provided on the fourth insulating layer 19. The second transparent electrode layer 20 includes a transparent electrode 20*a* which is electrically separated from the pixel electrode 18*a*. This transparent electrode 20*a* functions as the common electrode. The common electrode 20*a* opposes the pixel electrode 18*a* via the fourth insulating layer 19. The pixel electrode 18*a*, the common electrode 20*a*, and the fourth insulating layer 19 lying between the pixel electrode 18*a* and the common electrode 20*a* form storage capacitance. The common electrode 20*a* has at least one slit 20*as*.

On the common electrode 20*a*, an unshown alignment film is provided. The TFT substrate 100 that has the above-described configuration is suitably used in FFS (Fringe Field Switching) mode liquid crystal display devices.

In the TFT substrate 100 of the present embodiment, as previously described, when viewed in the normal direction of the substrate 10, the first contact hole CH1 overlaps the end portion 16*de* of the drain electrode 16*d* on the second portion 14*b* side and the second portion 14*b* of the oxide semiconductor layer 14. Thus, part of the first contact hole CH1 can be a light transmissive region T in which none of the gate electrode 12*g* and the drain electrode 16*d* blocks light. Note that the interlayer insulating layer (third insulating layer) 17 of the TFT substrate 100 does not include an organic insulating layer, and therefore, the first contact hole CH1 is relatively shallow. Therefore, the disturbance in the liquid crystal alignment which is attributed to the first contact hole CH1 is small, and light leakage near the first contact hole CH1 is small. Thus, provision of the above-described light transmissive region T does not adversely affect displaying of images. As described herein, by utilizing part of the first contact hole CH1 as the light transmissive region T, the light utilization efficiency can be increased.

Now, the effects of the TFT substrate 100 of the present embodiment are described more specifically with reference to a TFT substrate of a comparative example that includes a interlayer insulating layer including the organic insulating layer.

Figure 3:
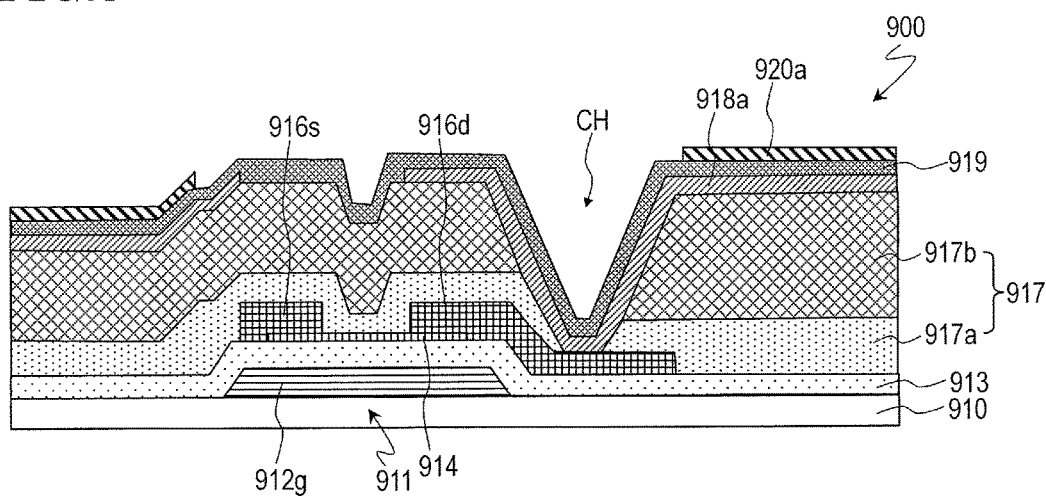
[FIG. 3] A cross-sectional view schematically showing a TFT substrate 900 of a comparative example.

FIG. 3 shows a TFT substrate 900 of a comparative example. FIG. 3 is a cross-sectional view schematically showing the TFT substrate 900 of the comparative example.

The TFT substrate 900 of the comparative example includes a substrate 910 and a TFT 911 supported by the substrate 910 as shown in FIG. 3. The TFT 911 includes a gate electrode 912*g*, a source electrode 916*s*, a drain electrode 916*d* and an oxide semiconductor layer 914.

The gate electrode 912*g* is provided on the substrate 910, and a gate insulating layer 913 is provided so as to cover the gate electrode 912*g*. The oxide semiconductor layer 914 is provided on the gate insulating layer 913. The entirety of the oxide semiconductor layer 914 extends over the gate electrode 912*g*.

On the gate insulating layer 913 and the oxide semiconductor layer 914, the source electrode 916*s* and the drain electrode 916*d* are provided. An interlayer insulating layer 917 is provided so as to cover the source electrode 916*s* and the drain electrode 916*d*. The interlayer insulating layer 917 includes an inorganic insulating layer 917*a* which is made of an inorganic insulating material and an organic insulating layer 917*b* which is provided on the inorganic insulating layer 917*a* and which is made of an organic insulating material.

The interlayer insulating layer 917 has a contact hole CH. When viewed in the normal direction of the substrate 911, the contact hole CH overlaps the drain electrode 916*d*.

On the interlayer insulating layer 917, a pixel electrode 918*a* is provided. The pixel electrode 918*a* is made of a transparent electrically-conductive material. The pixel electrode 918*a* is in contact with the drain electrode 916*d* in the contact hole CH.

A storage capacitance insulating layer 919 is provided so as to cover the pixel electrode 918*a*. On the storage capacitance insulating layer 919, a common electrode 920*a* is provided.

In the TFT substrate 900 of the comparative example, the entirety of the contact hole CH is shielded from light by the drain electrode 916*d*. The reasons for this are described in the following section.

The TFT substrate 900 of the comparative example employs such a configuration that the interlayer insulating layer 917 includes the organic insulating layer 917*b* in order to reduce the parasitic capacitance formed by overlapping of the pixel electrode 918*a* (or the common electrode 920*a*) with the source wire and/or the gate wire. However, since the organic insulating layer 917*b* is thick, the total thickness of the interlayer insulating layer 917 is large, and the contact hole CH is deep. Thus, in a liquid crystal display device which includes this TFT substrate 900, the disturbance in the liquid crystal alignment which is attributed to the contact hole CH is large, and there is a probability that light leakage occurs. In view of such, the entirety of the contact hole CH is shielded from light. As a result, in the TFT substrate 900 of the comparative example, the area ratio of the shielded region within the pixel increases, and the light utilization efficiency decreases.

On the other hand, in the TFT substrate 100 of the present embodiment, the first contact hole CH1 is formed such that the end portion 16*de* of the drain electrode 16*d* is exposed. In other words, when viewed in the normal direction of the substrate 10, part of the first contact hole CH1 does not overlap the drain electrode 16*d*. The first contact hole CH1 is arranged so as to overlap an extended part (second portion 14*b*) extending from a portion of the oxide semiconductor layer 14 overlapping the gate electrode 12*g* (first portion 14*a*) so as to lie across an edge of the gate electrode 12*g* on the drain electrode 16*d* side. Therefore, the first contact hole CH1 includes a portion which does not overlap the gate electrode 12*g* when viewed in the normal direction of the substrate 10. Thus, the portion T of the first contact hole CH1 is not shielded from light by the drain electrode 16*d* or the gate electrode 12*g* and can contribute as a light transmissive region to displaying. As a result, in the TFT substrate 100 of the present embodiment, the light utilization efficiency can be better than in the TFT substrate 900 of the comparative example. Since the third insulating layer (interlayer insulating layer) 17 does not include an organic insulating layer, the light transmittance also improves.

Further, in a liquid crystal display device which includes the TFT substrate 100, the power consumption of the entire device can be reduced by reducing the power consumption of the backlight (illuminator element). This is because, as previously described, in the TFT substrate 100, the area ratio of the shielded region within the pixel P can be decreased, and therefore, even if the power consumption of the backlight is reduced, displaying can be realized at equal brightness to those achieved in conventional devices.

Now, the reasons why the first contact hole CH1 does not need to be entirely shielded from light in the TFT substrate 100 of the present embodiment are described.

Since the third insulating layer (interlayer insulating layer) 17 of the TFT substrate 100 is made of an inorganic insulating material and is relatively thin, the first contact hole CH1 that is for electrical connection between the drain electrode 16d and the pixel electrode 18a does not need to be deep. Further, since the third insulating layer 17 is thin, the hole diameter of the first contact hole CH1 can also be reduced. Therefore, the light leakage which is attributed to the disturbance in the state of alignment of liquid crystal molecules near the first contact hole CH1 is suppressed as compared with the TFT substrate 900 of the comparative example. Therefore, the high display quality can be maintained without the necessity of shielding the entirety of the first contact hole CH1 from light by the drain electrode 16d and the gate electrode 12g.

When viewed in the normal direction of the substrate 10, the area ratio of the drain electrode 16d to the first contact hole CH1 is preferably smaller than the area ratio of the oxide semiconductor layer 14 to the first contact hole CH1. The contact area between the pixel electrode 18a and the drain electrode 16d in the first contact hole CH1 is preferably smaller than the contact area between the pixel electrode 18a and the second portion 14b of the oxide semiconductor layer 14. Due to these features, the ratio of the shielded region near the first contact hole CH1 can be reduced and, accordingly, decrease of the light utilization efficiency can be suppressed more effectively.

As previously described, in the TFT substrate 100, the hole diameter of the first contact hole CH1 can be reduced. Therefore, storage capacitance which has a greater capacitance value than those of conventional devices can be formed in the pixel P. By increasing the capacitance value of the storage capacitance, the proportion of the parasitic capacitance between the gate and the drain (Cgd) to the total capacitance of the pixel P (Liquid crystal capacitance Clc+ Storage capacitance Cs+Parasitic capacitance between gate and drain Cgd) can be decreased, and the effect of the feed-through voltage can be reduced.

The above-described effect (the effect of improving the light utilization efficiency) can be obtained also in a configuration from which the second insulating layer (etch stop layer) 15 of the TFT substrate 100 is omitted. Note that, however, by providing the second insulating layer 15 as in the present embodiment, the effects which will be described in the following section can be further obtained.

The second insulating layer 15 functions as an etch stop in patterning an electrically-conductive film which is to be the source electrode 16s and the drain electrode 16d and protects the channel region of the oxide semiconductor layer 14. Therefore, the reliability of the TFT 11 can be improved.

Since the first contact hole CH1 consists of the opening 15a of the second insulating layer 15 and the opening 17a of the third insulating layer 17, the taper angle of the first contact hole CH1 can be made moderate by separately etching the second insulating layer 15 and the third insulating layer 17. As such, occurrence of light leakage due to the disturbance in the alignment of liquid crystal molecules which is attributed to a step of the first contact hole CH1 can be further reduced.

Figure 4:
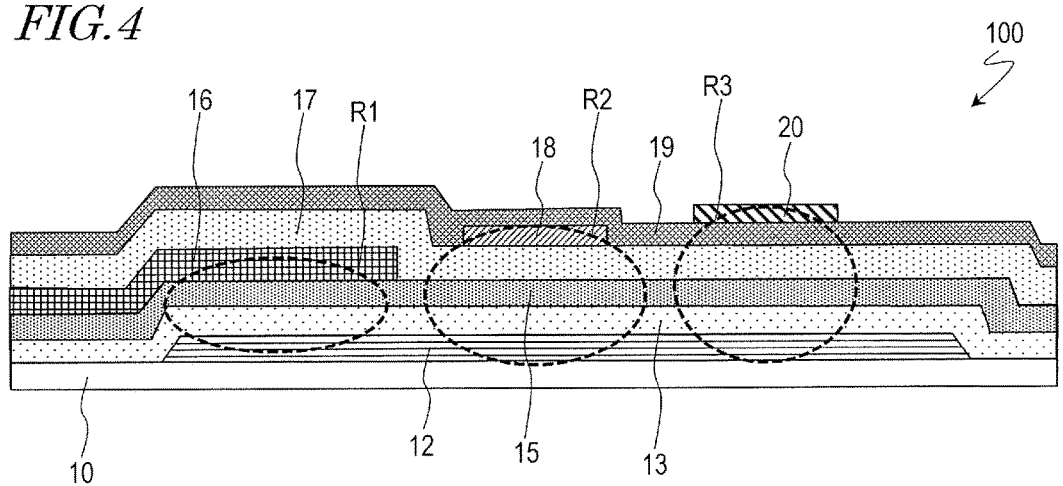
[FIG. 4] A cross-sectional view schematically showing the TFT substrate 100 of an embodiment of the present invention.

Provision of the second insulating layer 15 can reduce the parasitic capacitance between the first metal layer 12 and another electrically-conductive layer (the second metal layer 16, the first transparent electrode layer or the second transparent electrode layer 20) and can further reduce the power consumption. FIG. 4 shows another cross section of the TFT substrate 100 which is different from FIG. 1.

As shown in the region R1 of FIG. 4, the second insulating layer 15 is present, in addition to the first insulating layer 13, between the first metal layer 12 and the second metal layer 16. Therefore, the parasitic capacitance between the first metal layer 12 and the second metal layer 16 is reduced.

As shown in the region R2 of FIG. 4, the second insulating layer 15 is present, in addition to the first insulating layer 13 and the third insulating layer 17, between the first metal layer 12 and the first transparent electrode layer 18. Therefore, the parasitic capacitance between the first metal layer 12 and the first transparent electrode layer 18 is reduced.

As shown in the region R3 of FIG. 4, the second insulating layer 15 is present, in addition to the first insulating layer 13, the third insulating layer 17 and the fourth insulating layer 19, between the first metal layer 12 and the second transparent electrode layer 20. Therefore, the parasitic capacitance between the first metal layer 12 and the second transparent electrode layer 20 is reduced.

Figure 5:
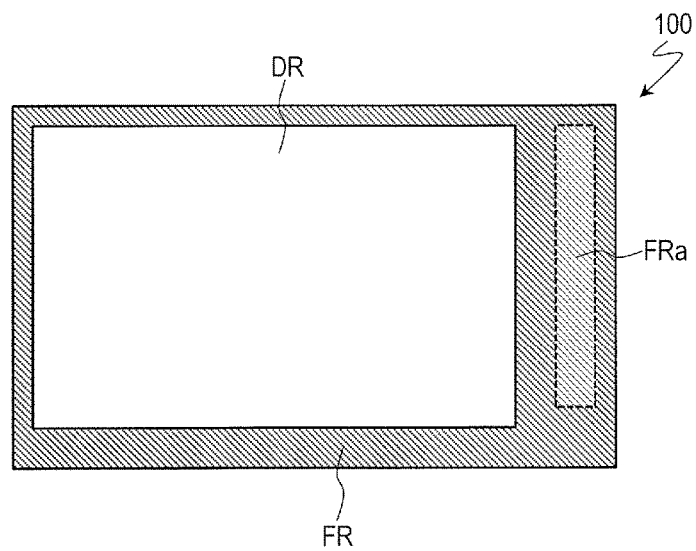
[FIG. 5] (a) is a diagram showing an example of the planar configuration of the TFT substrate 100. (b) is a cross-sectional view showing an example of a S-COM connecting portion. (c) is a cross-sectional view showing an example of a terminal provided in a terminal section FRa.
Figure 5:
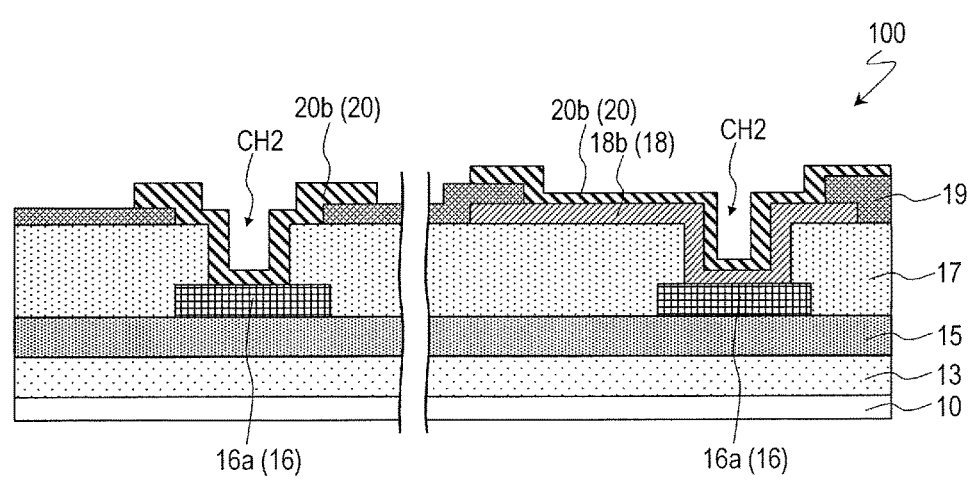
Figure 5:
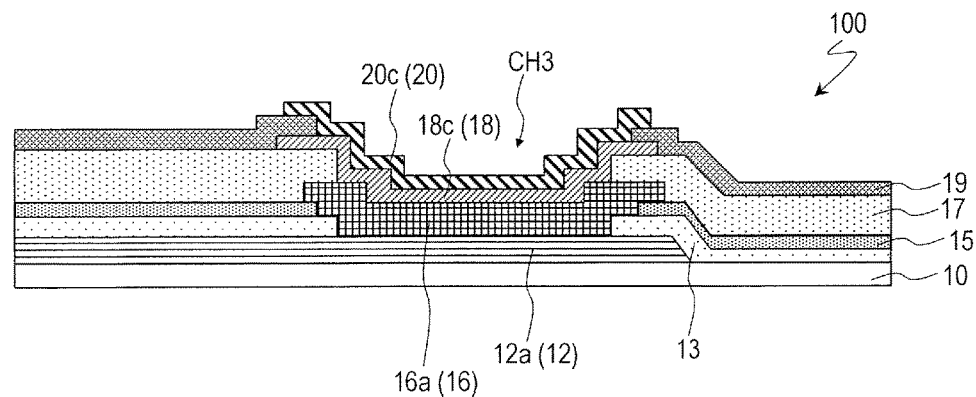

Now, a specific configuration example for applying a common signal to the common electrode 20a is described with reference to FIG. 5.

FIG. 5(a) is a diagram showing an example of the planar configuration of the TFT substrate 100. As shown in FIG. 5(a), the TFT substrate 100 includes a display region (active region) DR and a peripheral region (frame region) FR which is present around the display region DR. In the display region DR, a plurality of pixels P are arranged in a matrix. Each of the pixels P includes a TFT 11, a pixel electrode 18a and a common electrode 20a. The common electrode 20a extends over generally the entire display region DR except for a region near the first contact hole CH1 of each pixel P, for example. Among the respective pixels P, the common electrodes 20a are supplied with equal potentials.

The peripheral region FR includes a terminal section FRa in which a plurality of terminals are provided. The peripheral region FR further includes an upper wire layer (not shown in FIG. 5(a)) which is formed by the same electrically-conductive film as the source wire S and a lower wire layer (not shown in FIG. 5(a)) which is formed by the same electrically-conductive film as the gate wire G. Various signals input from external wires to the terminals of the terminal section FRa are supplied to the display region DR via the upper wire layer and/or the lower wire layer. For example, the scan signal and the display signal are supplied to the gate wire G and the source wire S, respectively, via the upper wire layer and/or the lower wire layer. The common signal is supplied to the common electrode 20a via the upper wire layer and/or the lower wire layer. In a configuration which will be illustrated in the following section, a S-COM connecting portion is provided in the peripheral region FR for connection between the upper wire layer and the common electrode 20a. Further, a S-G connecting portion (reconnecting portion) may be provided in the peripheral region FR for connection between the upper wire layer and the lower wire layer.

The left part of FIG. 5(b) shows an example of the cross-sectional configuration of the S-COM connecting portion. The right part of FIG. 5(b) shows another example of the cross-sectional configuration of the S-COM connecting portion.

In the configuration illustrated in FIG. 5(b), an upper wire layer 16a is provided on the second insulating layer 15. The upper wire layer 16a is formed by the same electrically-conductive film as the source wire S. That is, the second metal layer 16 includes the upper wire layer 16a. The third insulating layer 17 and the fourth insulating layer 19 have a second contact hole CH2 which overlaps the upper wire layer 16a when viewed in the normal direction of the substrate 10.

In the configuration shown in the left part of FIG. 5(b), the second transparent electrode layer 20 further includes a transparent connecting layer 20b which is electrically coupled with the common electrode 20a. This transparent connecting layer 20b is in contact with the upper wire layer 16a in the second contact hole CH2. Therefore, in this configuration, the upper wire layer 16a and the common electrode 20a are electrically coupled with each other via the transparent connecting layer 20b.

In the configuration shown in the right part of FIG. 5(b), the first transparent electrode layer 18 further includes a first transparent connecting layer 18b which is electrically separated from the pixel electrode 18a. The second transparent electrode layer 20 further includes a second transparent connecting layer 20b which is electrically coupled with the common electrode 20a. The first transparent connecting layer 18b is in contact with the upper wire layer 16a in the second contact hole CH2. The second transparent connecting layer 20b is in contact with the first transparent connecting layer 18b in the second contact hole CH2. Therefore, in this configuration, the upper wire layer 16a and the common electrode 20a are electrically coupled with each other via the first transparent connecting layer 18b and the second transparent connecting layer 20b.

FIG. 5(c) shows an example of the cross-sectional configuration of a terminal provided in the terminal section FRa.

In the configuration shown in FIG. 5(c), a lower wire layer 12a is provided on the substrate 10. The lower wire layer 12a is formed by the same electrically-conductive film as the gate wire G. The upper wire layer 16a is provided on the second insulating layer 15. The upper wire layer 16a is formed by the same electrically-conductive film as the source wire S. That is, the first metal layer 12 includes the lower wire layer 12a, and the second metal layer 16 includes the upper wire layer 16a. The first transparent electrode layer 18 further includes a third transparent connecting layer 18c. The second transparent electrode layer further includes a fourth transparent connecting layer 20b.

The first insulating layer 13, the second insulating layer 15, the third insulating layer 17 and the fourth insulating layer 19 have a third contact hole CH3 which overlaps the lower wire layer 12a and the upper wire layer 16a when viewed in the normal direction of the substrate 10. In this third contact hole CH3, the upper wire layer 16a is in contact with the lower wire layer 12a, the third transparent connecting layer 18c is in contact with the upper wire layer 16a, and a fourth transparent connecting layer 20c is in contact with the third transparent connecting layer 18c. Therefore, in this configuration, the lower wire layer 12a and the fourth transparent connecting layer 20c are electrically coupled with each other via the upper wire layer 16a and the third transparent connecting layer 18c.

When the S-COM connecting portion shown in the left part of FIG. 5(b) and the terminal shown in FIG. 5(c) are used in combination, the S-G connecting portion (re-connecting portion) is provided between these parts, whereby the common signal input to the terminal of the terminal section FRa can be supplied to the common electrode 20a via the fourth transparent connecting layer 20c, the third transparent connecting layer 18c, the upper wire layer 16a, the lower wire layer 12a, the upper wire layer 16a and the transparent connecting layer 20b. Likewise, when the S-COM connecting portion shown in the right part of FIG. 5(b) and the terminal shown in FIG. 5(c) are used in combination, the S-G connecting portion (re-connecting portion) is provided between these parts, whereby the common signal input to the terminal of the terminal section FRa can be supplied to the common electrode 20a via the fourth transparent connecting layer 20c, the third transparent connecting layer 18c, the upper wire layer 16a, the lower wire layer 12a, the upper wire layer 16a, the first transparent connecting layer 18b and the second transparent connecting layer 20b.

Figure 6:
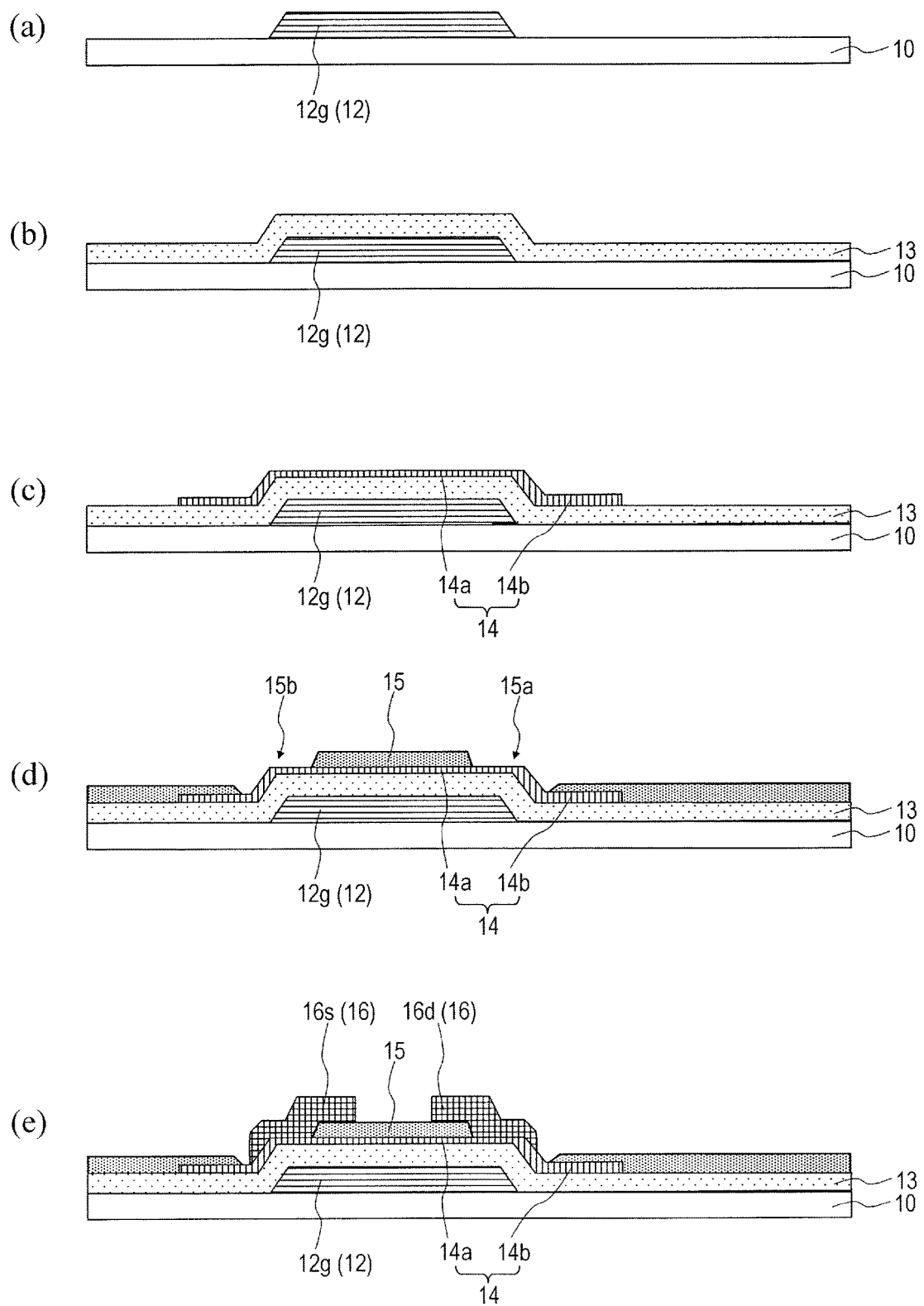
[FIG. 6] (a) to (e) are cross-sectional views of the steps for schematically illustrating a manufacture process of the TFT substrate 100.
Figure 7:
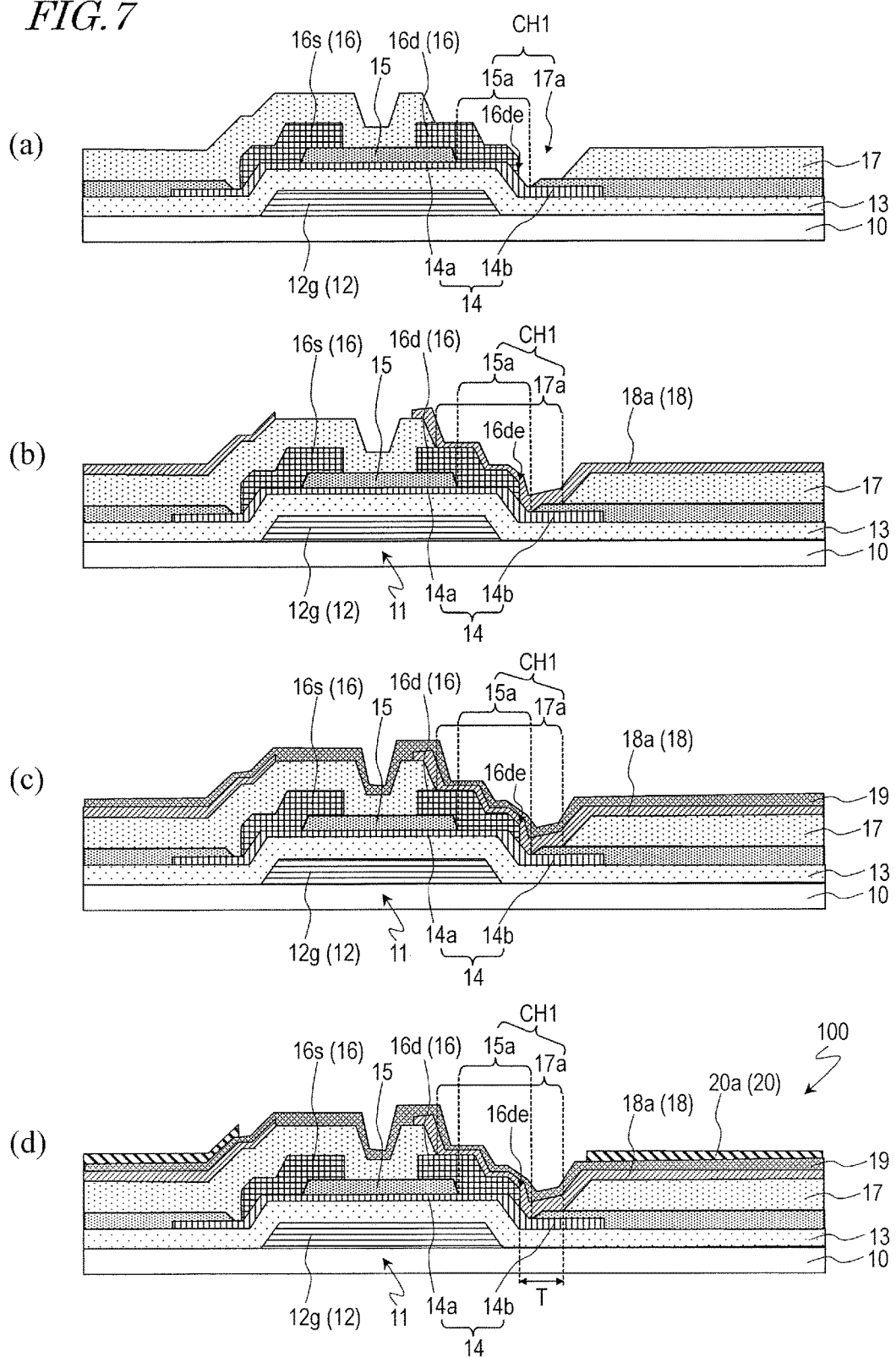
[FIG. 7] (a) to (d) are cross-sectional views of the steps for schematically illustrating a manufacture process of the TFT substrate 100.

Next, a manufacturing method of the TFT substrate 100 is described with reference to FIG. 6 and FIG. 7. FIGS. 6(a) to 6(e) and FIGS. 7(a) to 7(d) are cross-sectional views of the steps for schematically illustrating the manufacture process of the TFT substrate 100.

First, a first metal layer 12 which includes a gate electrode 12g, a gate wire G and a lower wire layer 12a is formed on a substrate (e.g., glass substrate) 10 as shown in FIG. 6(a). Specifically, after a first electrically-conductive film is deposited on the substrate 10, the first electrically-conductive film is patterned, whereby the first metal layer 12 is formed. As the material of the first electrically-conductive film, for example, aluminum (Al), chromium (Cr), copper (Cu), tantalum (Ta), titanium (Ti), molybdenum (Mo) or tungsten (W), or an alloy thereof, can be used. The first electrically-conductive film may be a single-layer structure or may be a multilayer structure consisting of a plurality of layers. For example, a multilayer structure of Ti/Al/Ti (upper layer/middle layer/lower layer) or a multilayer structure of Mo/Al/Mo can be used. The multilayer structure of the first electrically-conductive film is not limited to a three-layer structure but may be a two-layer structure or a multilayer structure consisting of four or more layers. The first electrically-conductive film only needs to include at least a layer which is made of a metal material. When the first electrically-conductive film is a multilayer structure, some layers may be made of a metal nitride or a metal oxide. Here, after the first electrically-conductive film is formed by sequentially depositing a TaN layer having a thickness of 5 nm to 100 nm and a W layer having a thickness of 50 nm to 500 nm by, for example, sputtering, the first electrically-conductive film is patterned through a photolithography process, whereby the first metal layer 12 is formed.

Then, a first insulating layer (gate insulating layer) 13 is formed on the first metal layer 12 as shown in FIG. 6(b). The first insulating layer 13 is, for example, a silicon oxide ($SiO_x$) film, a silicon nitride ($SiN_x$) film, a silicon oxynitride ($SiO_xN_y$, x>y) film, a silicon nitroxide ($SiN_xO_y$, x>y) film, an aluminum oxide film or a tantalum oxide film, or a multilayer film thereof. Here, a $SiN_x$ film having a thickness of 100 nm to 500 nm and a $SiO_2$ film having a thickness of 20 nm to 100 nm are sequentially deposited by, for example, CVD (Chemical Vapor Deposition), whereby the first insulating layer 13 is formed.

Then, an oxide semiconductor layer 14 is formed on the first insulating layer 13 as shown in FIG. 6(c). Specifically, after an oxide semiconductor film is deposited on the first insulating layer 13, the oxide semiconductor film is patterned, whereby the oxide semiconductor layer 14 in the shape of an island is formed. The oxide semiconductor layer 14 formed in this step includes a first portion 14a lying above the gate electrode 12g and a second portion 14b extending from the first portion 14a so as to lie across an edge of the gate electrode 12g on the drain electrode 16d side. Here, after an In—Ga—Zn—O based semiconductor film having a thickness of 20 nm to 200 nm is deposited, this semiconductor film is patterned through a photolithography process, whereby the oxide semiconductor layer 14 is formed.

The In—Ga—Zn—O based semiconductor is a ternary oxide consisting of In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2.

A TFT which includes an In—Ga—Zn—O based semiconductor layer has high mobility (20 times or more as compared with an a-Si TFT) and low current leakage (less than 1/100 as compared with an a-Si TFT), and is therefore suitably used as a driver TFT and a pixel TFT. When a TFT which includes an In—Ga—Zn—O based semiconductor layer is used, the power consumption of the display device can be greatly reduced.

The In—Ga—Zn—O based semiconductor may be amorphous or may include a crystalline portion. As the crystalline In—Ga—Zn—O based semiconductor, a crystalline In—Ga—Zn—O based semiconductor of which the c-axis is oriented generally perpendicular to the layer surface is preferred. The crystalline structure of such an In—Ga—Zn—O based semiconductor is disclosed in, for example, Japanese Laid-Open Patent Publication No. 2012-134475. The entire disclosure of Japanese Laid-Open Patent Publication No. 2012-134475 is incorporated by reference in this specification.

The oxide semiconductor layer 14 may include a different oxide semiconductor instead of the In—Ga—Zn—O based semiconductor. For example, the oxide semiconductor layer 14 may include a Zn—O based semiconductor (ZnO), an In—Zn—O based semiconductor (IZO (registered trademark)), a Zn—Ti—O based semiconductor (ZTO), a Cd—Ge—O based semiconductor, a Cd—Pb—O based semiconductor, CdO (cadmium oxide), a Mg—Zn—O based semiconductor, an In—Sn—Zn—O based semiconductor (e.g., $In_2O_3$—$SnO_2$—ZnO), an In—Ga—Sn—O based semiconductor, or the like.

Then, openings for electrical connection between the lower wire layer 12a and the upper wire layer 16a (not shown here; see FIG. 5(c) as to the terminal section FRa) are formed in the first insulating layer 13 of the terminal section FRa and the S-G connecting portion. Specifically, the first insulating layer 13 is patterned such that the lower wire layer 12a is exposed.

Then, as shown in FIG. 6(d), a second insulating layer (etch stop layer) 15 is formed on the oxide semiconductor layer 14. The second insulating layer (etch stop layer) 15 includes a portion covering the channel region of the oxide semiconductor layer 14. In regions of the second insulating layer 15 corresponding to the drain and source regions of the oxide semiconductor layer 14, openings 15a and 15b are formed by patterning. That is, parts of the second insulating layer 15 are removed such that parts of the oxide semiconductor 14 are exposed. In this patterning, openings for electrical connection between the lower wire layer 12a and the upper wire layer 16a (not shown here; see FIG. 5(c) as to the terminal section FRa) are formed in the second insulating layer 15 of the terminal section FRa and the S-G connecting portion. The second insulating layer 15 is, for example, a silicon oxide ($SiO_x$) film, a silicon nitride ($SiN_x$) film, a silicon oxynitride ($SiO_xN_y$, x>y) film, a silicon nitroxide ($SiN_xO_y$, x>y) film, an aluminum oxide film or a tantalum oxide film, or a multilayer film thereof. Here, as the second insulating layer 15, a $SiO_2$ film having a thickness of 10 nm to 500 nm is deposited by, for example, CVD. On the $SiO_2$ film, a heat treatment is performed in air at 150° C. to 500° C. for 0.5 hour to 12 hours.

Then, as shown in FIG. 6(e), a second metal layer 16 is formed on the oxide semiconductor layer 14 and the second insulating layer 15. The second metal layer 16 includes a source electrode 16s, a drain electrode 16d, a source wire S and an upper wire layer 16a. Specifically, after a second electrically-conductive film is formed on the oxide semiconductor layer 14 and the second insulating layer 15, the second electrically-conductive film is patterned, whereby the second metal layer 16 is formed. The patterning of the second electrically-conductive film is performed such that the source electrode 16s and the drain electrode 16d cover an end of a portion of the second insulating layer (etch stop layer) 15 corresponding to the channel region. As the material of the second electrically-conductive film, for example, aluminum (Al), chromium (Cr), copper (Cu), tantalum (Ta), titanium (Ti), molybdenum (Mo) or tungsten (W), or an alloy thereof, can be used. The second electrically-conductive film may be a single-layer structure or may be a multilayer structure consisting of a plurality of layers. For example, a multilayer structure of Ti/Al/Ti (upper layer/middle layer/lower layer) or a multilayer structure of Mo/Al/Mo can be used. The multilayer structure of the second electrically-conductive film is not limited to a three-layer structure but may be a two-layer structure or a multilayer structure consisting of four or more layers. The second electrically-conductive film only needs to include at least a layer which is made of a metal material. When the second electrically-conductive film is a multilayer structure, some layers may be made of a metal nitride or a metal oxide. Here, after the second electrically-conductive film is formed by sequentially depositing a Ti layer having a thickness of 10 nm to 100 nm, an Al layer having a thickness of 50 nm to 400 nm, and a Ti layer having a thickness of 50 nm to 300 nm by, for example, sputtering, the second electrically-conductive film is patterned through a photolithography process, whereby the second metal layer 16 is formed. In this patterning, the second insulating layer 15 functions as an etch stop. Therefore, the channel region of the oxide semiconductor layer 14 is protected, and the reliability of the TFT 11 improves.

Then, as shown in FIG. 7(a), a third insulating layer (interlayer insulating layer) 17 is formed on the second metal layer 16. The third insulating layer 17 formed in this step does not include an organic insulating layer. In a region of the third insulating layer 17 corresponding to the opening 15a of the second insulating layer 15, an opening 17a is formed by patterning. That is, part of the third insulating layer 17 is removed such that part of the drain electrode 16d and part of the oxide semiconductor layer 14 are exposed. In this patterning, an opening for electrical connection between the upper wire layer 16a and the third transparent connecting layer 18c (see FIG. 5(c)) is formed in the third insulating layer 17 of the terminal section FRa. In the third insulating layer 17 of the S-COM connecting portion, an opening for electrical connection between the upper wire layer 16a and the transparent connecting layer 20b (see the left part of FIG. 5(b)) or an opening for electrical connection between the upper wire layer 16a and the first transparent connecting layer 18b (see the right part of FIG. 5(b)) is formed. The third insulating layer 17 is, for example, a silicon oxide ($SiO_x$) film, a silicon nitride ($SiN_x$) film, a silicon oxynitride ($SiO_xN_y$, x>y) film, a silicon nitroxide ($SiN_xO_y$, x>y) film, an aluminum oxide film or a tantalum oxide film, or a multilayer film thereof. Here, after a $SiO_2$ film having a thickness of 50 nm to 500 nm is deposited, a heat treatment is performed on the SiO$_2$ film in air at 200° C. to 400° C. for 0.5 hour to 4 hours. Thereafter, a SiN$_x$ film having a thickness of 50 nm to 500 nm is deposited. The resultant multilayer film is the third insulating layer 17.

In the present embodiment, the opening 15a of the second insulating layer 15 and the opening 17a of the third insulating layer 17 constitute the first contact hole CH1 that overlaps the second portion 14b of the oxide semiconductor layer 14 and the end portion 16de of the drain electrode 16d when viewed in the normal direction of the substrate 10. That is, the first half of the process of forming the first contact hole CH1 in the second insulating layer 15 and the third insulating layer 17 (the step of forming the opening 15a in the second insulating layer 15) is included in the step of forming the second insulating layer 15, and the second half (the step of forming the opening 17a in the third insulating layer 17) is included in the step of forming the third insulating layer 17.

Then, as shown in FIG. 7(b), a first transparent electrode layer 18 is formed on the third insulating layer 17. The first transparent electrode layer 18 includes a pixel electrode (transparent electrically-conductive layer) 18a and a third transparent connecting layer 18c. (When the S-COM connecting portion shown in the right part of FIG. 5(b) is provided, the first transparent electrode layer 18 further includes a first transparent connecting layer 18b.) Specifically, after a third electrically-conductive film is deposited on the third insulating layer 17, the third electrically-conductive film is patterned, whereby the first transparent electrode layer 18 is formed. The patterning is carried out such that the pixel electrode 18a is in contact with the drain electrode 16d and the second portion 14b of the oxide semiconductor layer 14 in the first contact hole CH1. As the material of the third electrically-conductive film, various transparent electrically-conductive materials can be used. For example, a metal oxide such as ITO, IZO or ZnO can be used. Here, after a third electrically-conductive film is formed by depositing a metal oxide film having a thickness of 20 nm to 300 nm by, for example, sputtering, the third electrically-conductive film is patterned through a photolithography process, whereby the first transparent electrode layer 18 is formed.

Then, as shown in FIG. 7(c), a fourth insulating layer (storage capacitance insulating layer) 19 is formed on the first transparent electrode layer 18. In the fourth insulating layer 19 of the terminal section FRa, an opening for electrical connection between the third transparent connecting layer 18c and the fourth transparent connecting layer 20c (see FIG. 5(c)) is formed by patterning. In the fourth insulating layer 19 of the S-COM connecting portion, an opening for electrical connection between the upper wire layer 16a and the transparent connecting layer 20b (see the left part of FIG. 5(b)) or an opening for electrical connection between the first transparent connecting layer 18b and the second transparent connecting layer 20b (see the right part of FIG. 5(b)) is formed. The fourth insulating layer 19 is, for example, a silicon oxide (SiO$_x$) film, a silicon nitride (SiN$_x$) film, a silicon oxynitride (SiO$_x$N$_y$, x>y) film, a silicon nitroxide (SiN$_x$O$_y$, x>y) film, an aluminum oxide film or a tantalum oxide film, or a multilayer film thereof. Here, as the fourth insulating layer 19, a SiNX film having a thickness of 50 nm to 500 nm is deposited by, for example, CVD.

Thereafter, as shown in FIG. 7(d), a second transparent electrode layer 20 is formed on the fourth insulating layer 19. The second transparent electrode layer 20 includes a common electrode (transparent electrode) 20a and a fourth transparent connecting layer 20c. (When the S-COM connecting portion shown in the left part of FIG. 5(b) is provided, the second transparent electrode layer 20 further includes a transparent connecting layer 20b. When the S-COM connecting portion shown in the right part of FIG. 5(b) is provided, the second transparent electrode layer 20 further includes a second transparent connecting layer 20b.) Specifically, after a fourth electrically-conductive film is deposited on the fourth insulating layer 19, the fourth electrically-conductive film is patterned, whereby the second transparent electrode layer 20 is formed. As the material of the fourth electrically-conductive film, various transparent electrically-conductive materials can be used. For example, a metal oxide such as ITO, IZO or ZnO can be used. Here, after a fourth electrically-conductive film is formed by depositing a metal oxide film having a thickness of 20 nm to 300 nm by, for example, sputtering, the fourth electrically-conductive film is patterned through a photolithography process, whereby the second transparent electrode layer 20 is formed.

In such a way, the TFT substrate 100 can be formed. The TFT substrate 100 is suitably used in liquid crystal display devices.

Figure 8:
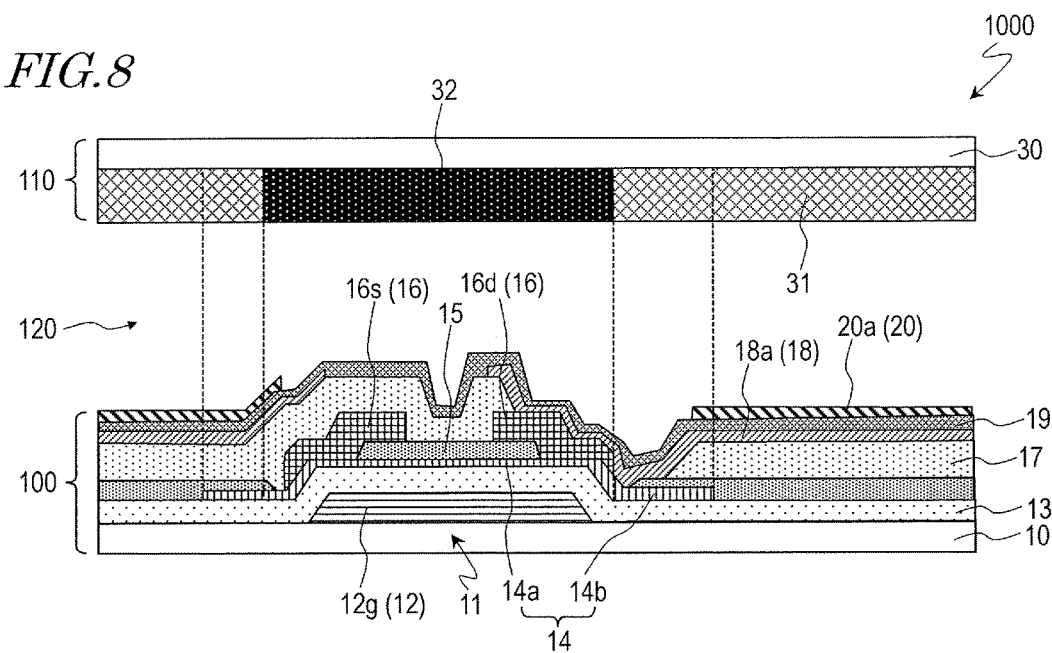
[FIG. 8] A cross-sectional view schematically showing a liquid crystal display device 1000 which includes the TFT substrate 100.

FIG. 8 shows a liquid crystal display device 1000 which includes the TFT substrate 100. As shown in FIG. 8, the liquid crystal display device 1000 includes a TFT substrate (active matrix substrate) 100, a counter substrate (color filter substrate) 110 which opposes the TFT substrate 100, and a liquid crystal layer 120 provided between the TFT substrate 100 and the counter substrate 110.

The counter substrate 110 includes a substrate 30, and a color filter layer 31 and a shield layer (black matrix) 32 supported by the substrate 30. The substrate 30 is a transparent substrate (e.g., glass substrate). The color filter layer 31 typically includes a red color filter, a green color filter and a blue color filter, and is made of a colored photosensitive resin material. The shield layer 32 is made of, for example, a black photosensitive resin material.

When the TFT substrate 100 that has the above-described configuration is used, the width of the shield layer 32 can be reduced such that the oxide semiconductor layer 14 extends beyond the shield layer 32 when viewed in the normal direction of the display surface as shown in FIG. 8. Therefore, the aperture ratio improves.

Next, a variation of the TFT substrate 100 of the present embodiment is described.

Figure 9:
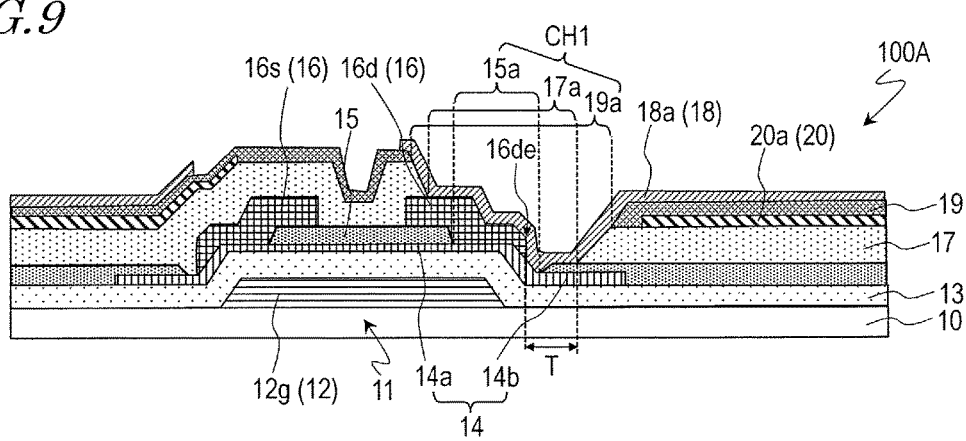
[FIG. 9] A cross-sectional view schematically showing a TFT substrate 100A that is a variation of the TFT substrate 100.

FIG. 9 shows a TFT substrate 100A that is a variation of the TFT substrate 100. FIG. 9 is a cross-sectional view schematically showing the TFT substrate 100A.

In the TFT substrate 100, as shown in FIG. 1, the fourth insulating layer (storage capacitance insulating layer) 19 covers the first transparent electrode layer 18, and the second transparent electrode layer 20 is provided on the fourth insulating layer 19. On the other hand, in the TFT substrate 100A, as shown in FIG. 9, the fourth insulating layer (storage capacitance insulating layer) 19 is provided between the third insulating layer (interlayer insulating layer) 17 and the first transparent electrode layer 18, and the second transparent electrode layer 20 that includes the common electrode 20a (a transparent electrode which is electrically separated from the pixel electrode 18a) is provided between the third insulating layer 17 and the fourth insulating layer 19. In the TFT substrate 100A, as shown in FIG. 9, the first contact hole CH1 is provided not only in the second insulating layer 15 and the third insulating layer 17 but also in the fourth insulating layer 19. That is, the first contact hole CH1 consists of the opening 15a of the second insulating layer 15, the opening 17a of the third insulating layer 17 and the opening 19a of the fourth insulating layer 19.

Also in the thus-configured TFT substrate 100A, the same effects can be achieved as those achieved by the TFT substrate 100.

Figure 10:
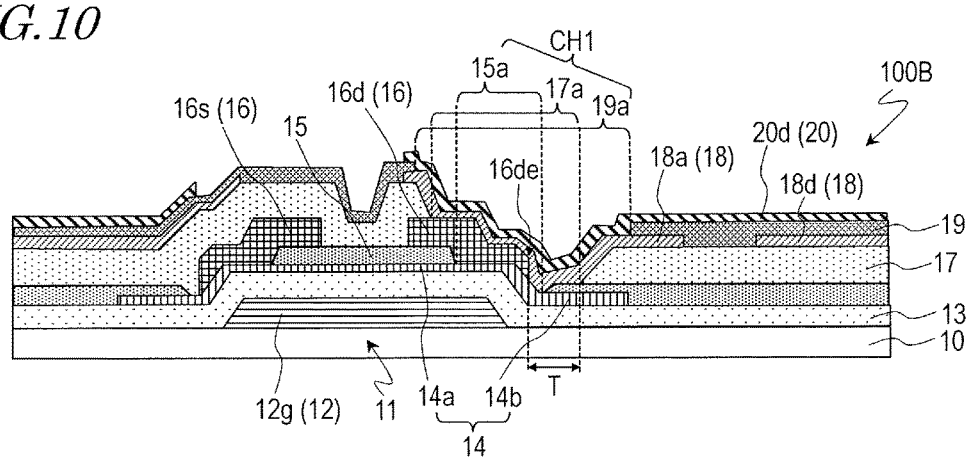
[FIG. 10] A cross-sectional view schematically showing a TFT substrate 100B that is another variation of the TFT substrate 100.

FIG. 10 shows a TFT substrate 100B that is a variation of the TFT substrate 100. FIG. 10 is a cross-sectional view schematically showing the TFT substrate 100B.

In the TFT substrate 100B, as shown in FIG. 10, the first contact hole CH1 is provided not only in the second insulating layer 15 and the third insulating layer 17 but also in the fourth insulating layer 19. That is, the first contact hole CH1 consists of the opening 15a of the second insulating layer 15, the opening 17a of the third insulating layer 17 and the opening 19a of the fourth insulating layer 19. The first transparent electrode layer 18 includes a first electrode 18d that is electrically separated from the transparent electrically-conductive layer 18a. The second transparent electrode layer 20 includes a second electrode 20d that is in contact with the transparent electrically-conductive layer 18a in the first contact hole CH1.

In the TFT substrate 100B, each of the pixels P includes a TFT 11, a first electrode 18d and a second electrode 20d. The first electrode 18d functions as a common electrode. The second electrode 20d functions as a pixel electrode.

When the TFT substrate 100B is used in a FFS mode liquid crystal display device, the pixel electrode 20d has at least one slit. Alternatively, the TFT substrate 100B may be used in a TN (Twisted Nematic) mode or VA (Vertical Alignment) mode liquid crystal display device.

Also in the thus-configured TFT substrate 100B, the same effects can be achieved as those achieved by the TFT substrates 100 and 100A.

Figure 11:
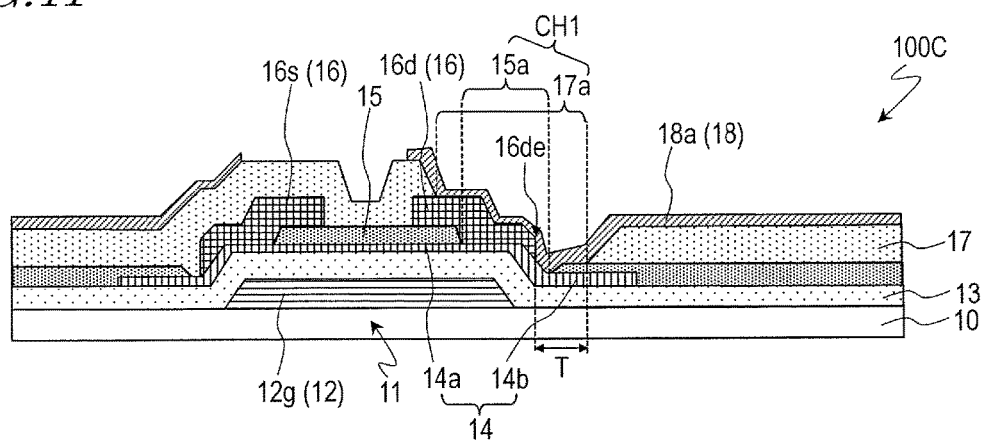
[FIG. 11] A cross-sectional view schematically showing a TFT substrate 100C that is still another variation of the TFT substrate 100.

FIG. 11 shows a TFT substrate 100C that is a variation of the TFT substrate 100. FIG. 11 is a cross-sectional view schematically showing the TFT substrate 100C.

The TFT substrate 100C has such a configuration that the fourth insulating layer 19 and the second transparent electrode layer 20 are omitted from the TFT substrate 100. Also in the thus-configured TFT substrate 100C, the same effects can be achieved as those achieved by the TFT substrates 100, 100A and 100B.

Embodiment 2

Figure 12:
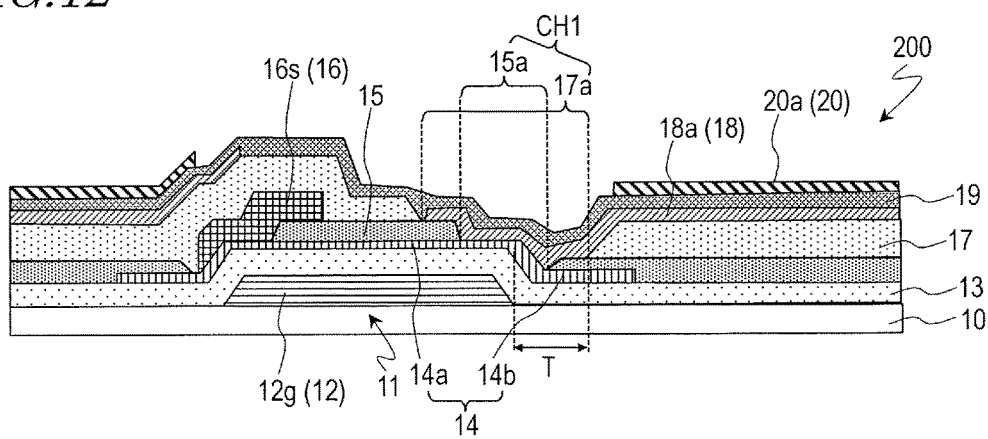
[FIG. 12] A cross-sectional view schematically showing a TFT substrate 200 of another embodiment of the present invention.

FIG. 12 shows a TFT substrate 200 of the present embodiment. FIG. 12 is a cross-sectional view schematically showing the TFT substrate 200. Note that, in the following description, the description is focused on the differences of the TFT substrate 200 from the TFT substrate 100 of Embodiment 1.

As shown in FIG. 12, the TFT substrate 200 is different from the TFT substrate 100 of Embodiment 1 in that the second metal layer 16 does not include the drain electrode of the TFT 11. In the TFT substrate 200, part of the first transparent electrode layer 18 which is in contact with the second portion 14b of the oxide semiconductor layer 14 functions as the drain electrode of the TFT 11.

Also in the TFT substrate 200 of the present embodiment, the first contact hole CH1 overlaps the second portion 14b of the oxide semiconductor layer 14 when viewed in the normal direction of the substrate 10. Therefore, part of the first contact hole CH1 can be a light transmissive region T which is not shielded from light by the gate electrode 12g. Thus, the light utilization efficiency can be increased.

Also in the TFT substrate 200, due to provision of the second insulating layer (etch stop layer) 15, the following effects can be achieved: the effect of improving the reliability of the TFT 11; the effect of reducing occurrence of light leakage which is attributed to the step in the first contact hole CH1; and the effect of reducing the parasitic capacitance between the first metal layer 12 and another electrically-conductive layer (the second metal layer 16, the first transparent electrode layer 18 or the second transparent electrode layer 20).

Further, in the TFT substrate 200 of the present embodiment, the second metal layer 16 does not include the drain electrode 16d, so that the reliability of the TFT 11 can be further improved. In the following section, this effect is described more specifically with reference to FIGS. 13(a) and 13(b).

Figure 13:
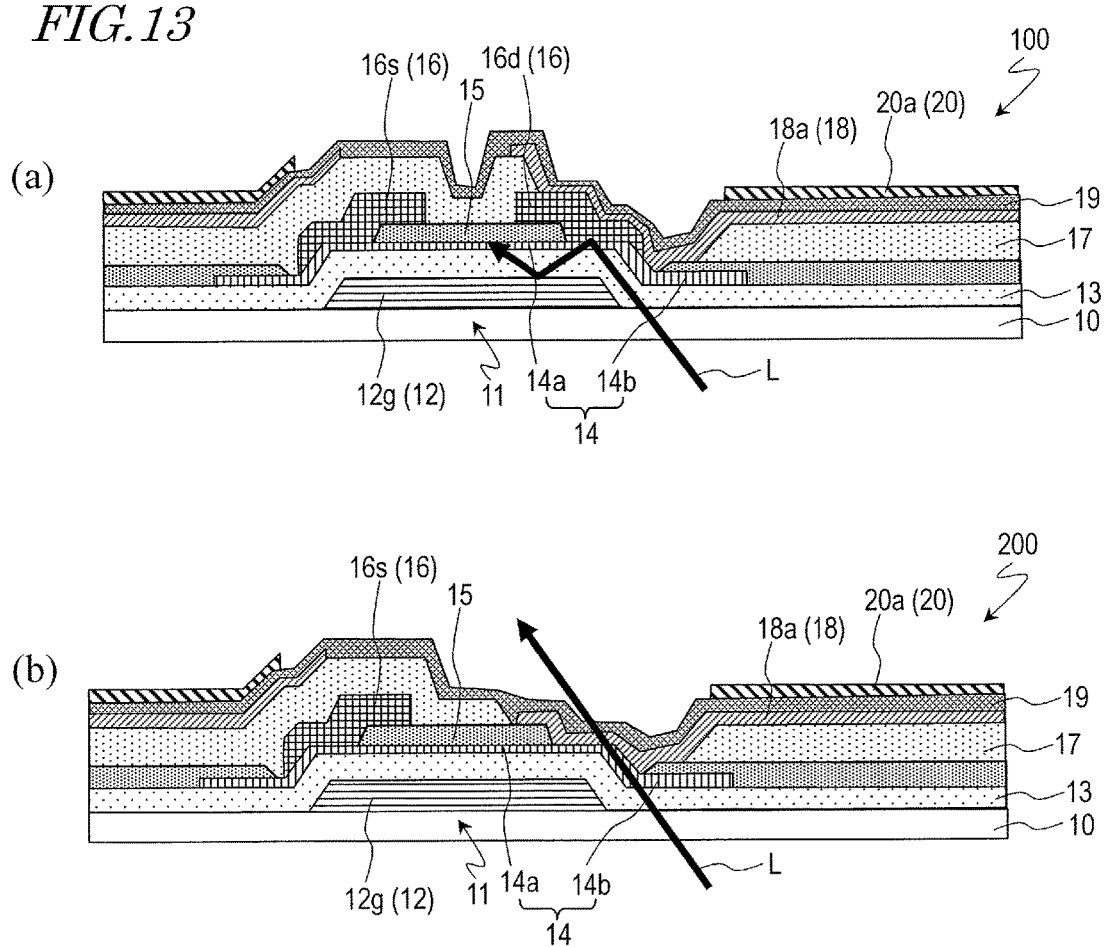
[FIG. 13] (a) and (b) are diagrams for illustrating the effects of the TFT substrate 200.

Since in the TFT substrate 100 of Embodiment 1 the second metal layer 16 includes the drain electrode 16d, light L entering from the rear surface side into the TFT substrate 100 is reflected by the gate electrode 12g (first metal layer 12) and the drain electrode 16d (second metal layer 16) to reach the channel region of the oxide semiconductor layer 14 as shown in FIG. 13(a), and can cause the characteristic variation (depression) of the TFT 11.

On the other hand, in the TFT substrate 200 of the present embodiment, since the second metal layer 16 does not include the drain electrode, the amount of light entering the channel region can be reduced as compared with the TFT substrate 100 of Embodiment 1 as illustrated in FIG. 13(b). Therefore, the characteristic variation (depression) of the TFT 11 can be suppressed.

Since in the TFT substrate 200 of the present embodiment the second metal layer 16 does not include the drain electrode 16d, the effect of improving the contrast ratio is achieved. When the second metal layer 16 does not include the drain electrode 16d, the step at the end portion 16de of the drain electrode 16d (see, for example, FIG. 1) does not exist, so that the disturbance in the alignment of the liquid crystal which is attributed to this step is reduced. Thus, light leakage at the time of black display is suppressed, so that the contrast ratio improves.

A configuration where the second metal layer 16 includes the drain electrode 16d as in the TFT substrate 100 of Embodiment 1 is defined by the source electrode 16s and the drain electrode 16d that are formed by electrically-conductive films whose channel lengths are equal, and therefore has such a merit that the variation of the channel length is unlikely to occur.

Figure 14:
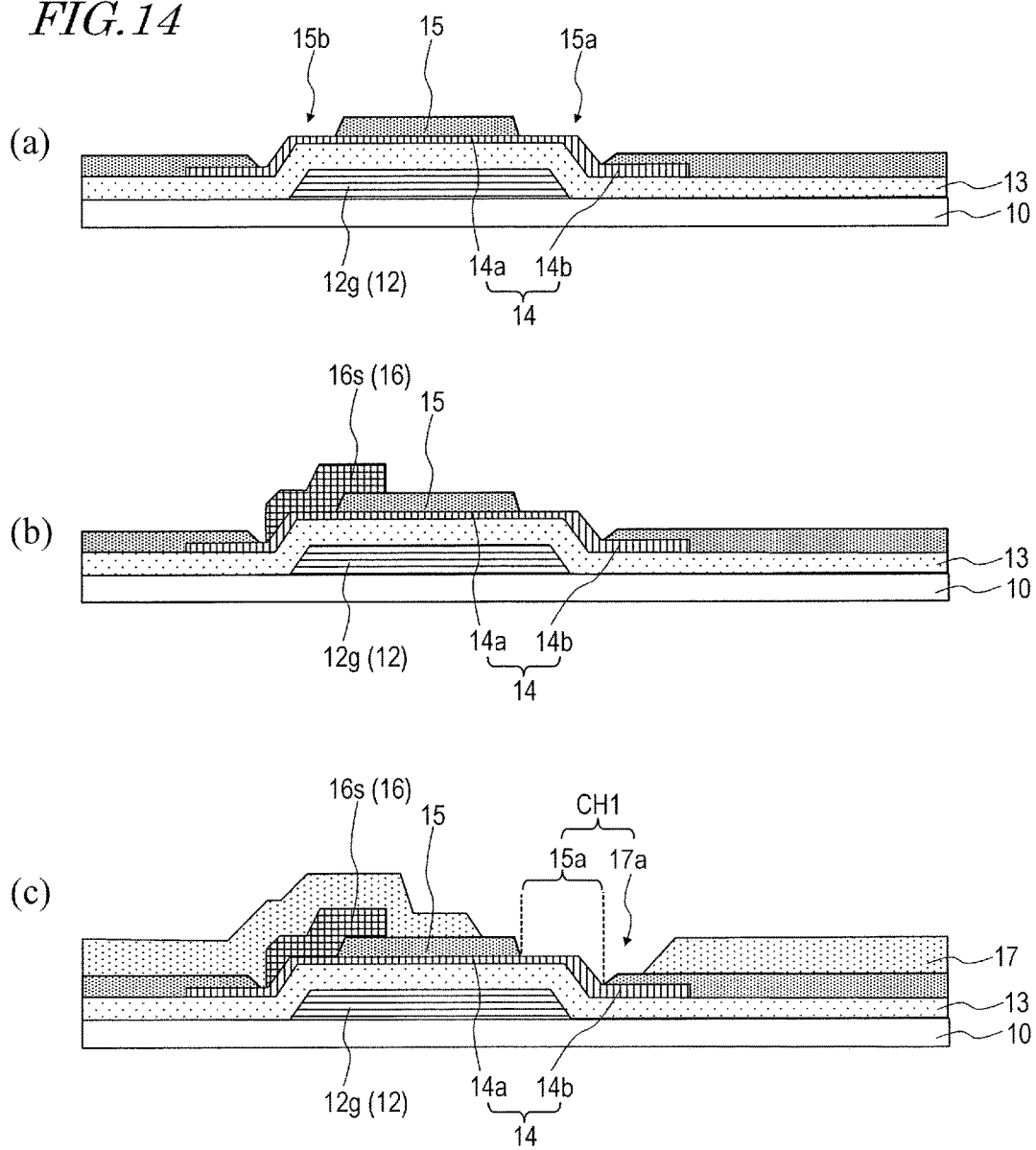
[FIG. 14] (a) to (c) are cross-sectional views of the steps for schematically illustrating a manufacture process of the TFT substrate 200.
Figure 15:
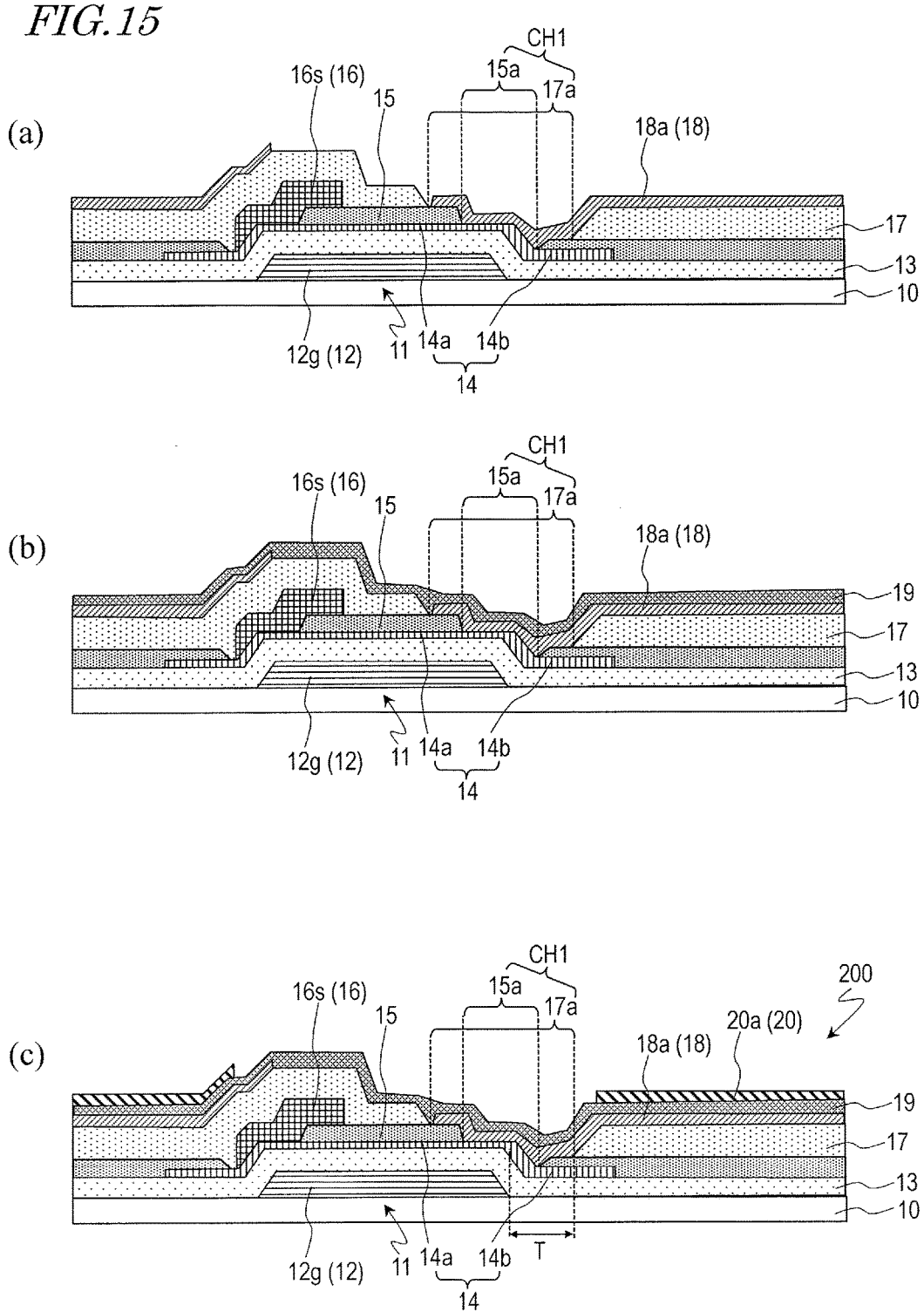
[FIG. 15] (a) to (c) are cross-sectional views of the steps for schematically illustrating a manufacture process of the TFT substrate 200.

Next, a manufacturing method of the TFT substrate 200 is described with reference to FIG. 14 and FIG. 15. FIGS. 14(a) to 14(c) and FIGS. 15(a) to 15(c) are cross-sectional views of the steps for schematically illustrating a manufacture process of the TFT substrate 200.

First, in the same way as the manufacturing method of the TFT substrate 100 of Embodiment 1 (the steps shown in FIGS. 6(a) to 6(d)), a first metal layer 12 which includes a gate electrode 12g, a first insulating layer (gate insulating layer) 13, an oxide semiconductor layer 14 and a second insulating layer (etch stop layer) 15 are formed on a substrate (e.g., glass substrate) 10 as shown in FIG. 14(a).

Then, as shown in FIG. 14(b), a second metal layer 16, which includes a source electrode 16s, is formed on the oxide semiconductor layer 14 and the second insulating layer 15. Specifically, after a second electrically-conductive film is formed on the oxide semiconductor layer 14 and the second insulating layer 15, the second electrically-conductive film is patterned, whereby the second metal layer 16 is formed. The patterning of the second electrically-conductive film is performed such that the source electrode 16s covers an end of a portion of the second insulating layer (etch stop layer) 15 corresponding to the channel region. As the material of the second electrically-conductive film, for example, aluminum (Al), chromium (Cr), copper (Cu), tantalum (Ta), titanium (Ti), molybdenum (Mo) or tungsten (W), or an alloy thereof, can be used. The second electrically-conductive film may be a single-layer structure or may be a multilayer structure consisting of a plurality of layers. For example, a multilayer structure of Ti/Al/Ti (upper layer/middle layer/lower layer) or a multilayer structure of Mo/Al/Mo can be used. The multilayer structure of the second electrically-conductive film is not limited to a three-layer structure but may be a two-layer structure or a multilayer structure consisting of four or more layers. The second electrically-conductive film only needs to include at least a layer which is made of a metal material. When the second electrically-conductive film is a multilayer structure, some layers may be made of a metal nitride or a metal oxide. Here, after the second electrically-conductive film is formed by sequentially depositing a Ti layer having a thickness of 10 nm to 100 nm, an Al layer having a thickness of 50 nm to 400 nm, and a Ti layer having a thickness of 50 nm to 300 nm by, for example, sputtering, the second electrically-conductive film is patterned through a photolithography process, whereby the second metal layer 16 is formed. In this patterning, the second insulating layer 15 functions as an etch stop. Therefore, the channel region of the oxide semiconductor layer 14 is protected, and the reliability of the TFT 11 improves.

Then, as shown in FIG. 14(c), a third insulating layer (interlayer insulating layer) 17 is formed on the second metal layer 16. The third insulating layer 17 formed in this step does not include an organic insulating layer. In a region of the third insulating layer 17 corresponding to the opening 15a of the second insulating layer 15, an opening 17a is formed by patterning. That is, part of the third insulating layer 17 is removed such that part of the oxide semiconductor 14 is exposed. The third insulating layer 17 is, for example, a silicon oxide ($SiO_x$) film, a silicon nitride ($SiN_x$) film, a silicon oxynitride ($SiO_xN_y$, x>y) film, a silicon nitroxide ($SiN_xO_y$, x>y) film, an aluminum oxide film or a tantalum oxide film, or a multilayer film thereof. Here, after a $SiO_2$ film having a thickness of 50 nm to 500 nm is deposited, a heat treatment is performed on the $SiO_2$ film in air at 200° C. to 400° C. for 0.5 hour to 4 hours. Thereafter, a $SiN_x$ film having a thickness of 50 nm to 500 nm is deposited. The resultant multilayer film is the third insulating layer 17.

In the present embodiment, the opening 15a of the second insulating layer 15 and the opening 17a of the third insulating layer 17 constitute the first contact hole CH1 that overlaps the second portion 14b of the oxide semiconductor layer 14 when viewed in the normal direction of the substrate 10. That is, the first half of the process of forming the first contact hole CH1 in the second insulating layer 15 and the third insulating layer 17 (the step of forming the opening 15a in the second insulating layer 15) is included in the step of forming the second insulating layer 15, and the second half (the step of forming the opening 17a in the third insulating layer 17) is included in the step of forming the third insulating layer 17.

Then, as shown in FIG. 15(a), a first transparent electrode layer 18, which includes a pixel electrode (transparent electrically-conductive layer) 18a, is formed on the third insulating layer 17. Specifically, after a third electrically-conductive film is deposited on the third insulating layer 17, the third electrically-conductive film is patterned, whereby the first transparent electrode layer 18 is formed. The patterning is carried out such that the pixel electrode 18a is in contact with the second portion 14b of the oxide semiconductor layer 14 in the first contact hole CH1. As the material of the third electrically-conductive film, various transparent electrically-conductive materials can be used. For example, a metal oxide such as ITO, IZO or ZnO can be used. Here, after a third electrically-conductive film is formed by depositing a metal oxide film having a thickness of 20 nm to 300 nm by, for example, sputtering, the third electrically-conductive film is patterned through a photolithography process, whereby the first transparent electrode layer 18 is formed.

Then, as shown in FIG. 15(b), a fourth insulating layer (storage capacitance insulating layer) 19 is formed on the first transparent electrode layer 18. The fourth insulating layer 19 is, for example, a silicon oxide ($SiO_x$) film, a silicon nitride ($SiN_x$) film, a silicon oxynitride ($SiO_xN_y$, x>y) film, a silicon nitroxide ($SiN_xO_y$, x>y) film, an aluminum oxide film or a tantalum oxide film, or a multilayer film thereof. Here, as the fourth insulating layer 19, a $SiN_x$ film having a thickness of 50 nm to 500 nm is deposited by, for example, CVD.

Thereafter, as shown in FIG. 15(c), a second transparent electrode layer 20, which includes a common electrode (transparent electrode) 20a, is formed on the fourth insulating layer 19. Specifically, after a fourth electrically-conductive film is deposited on the fourth insulating layer 19, the fourth electrically-conductive film is patterned, whereby the second transparent electrode layer 20 is formed. As the material of the fourth electrically-conductive film, various transparent electrically-conductive materials can be used. For example, a metal oxide such as ITO, IZO or ZnO can be used. Here, after a fourth electrically-conductive film is formed by depositing a metal oxide film having a thickness of 20 nm to 300 nm by, for example, sputtering, the fourth electrically-conductive film is patterned through a photolithography process, whereby the second transparent electrode layer 20 is formed.

In such a way, the TFT substrate 200 can be formed. The TFT substrate 200 is suitably used in liquid crystal display devices.

Figure 16:
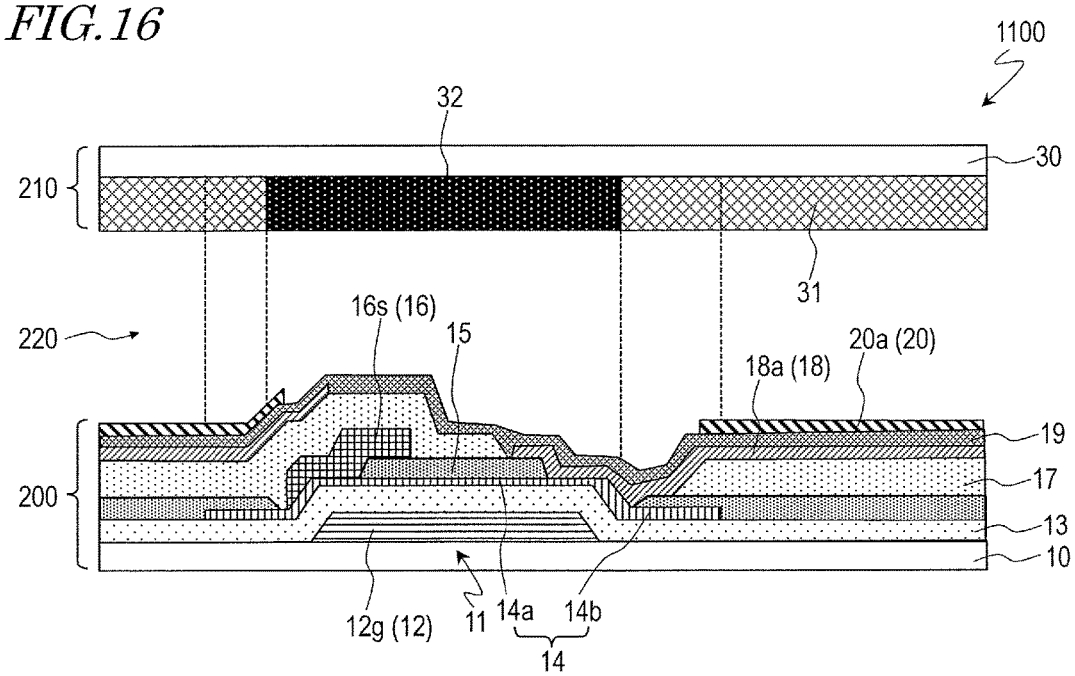
[FIG. 16] A cross-sectional view schematically showing a liquid crystal display device 1100 which includes the TFT substrate 200.

FIG. 16 shows a liquid crystal display device 1100 which includes the TFT substrate 200. As shown in FIG. 16, the liquid crystal display device 1100 includes a TFT substrate (active matrix substrate) 200, a counter substrate (color filter substrate) 210 which opposes the TFT substrate 200, and a liquid crystal layer 220 provided between the TFT substrate 200 and the counter substrate 210.

The counter substrate 210 includes a substrate 30, and a color filter layer 31 and a shield layer (black matrix) 32 supported by the substrate 30. The substrate 30 is a transparent substrate (e.g., glass substrate). The color filter layer 31 typically includes a red color filter, a green color filter and a blue color filter, and is made of a colored photosensitive resin material. The shield layer 32 is made of, for example, a black photosensitive resin material.

When the TFT substrate 200 that has the above-described configuration is used, the width of the shield layer 32 can be reduced such that the oxide semiconductor layer 14 extends beyond the shield layer 32 when viewed in the normal direction of the display surface as shown in FIG. 16. Therefore, the aperture ratio improves.

Figure 17:
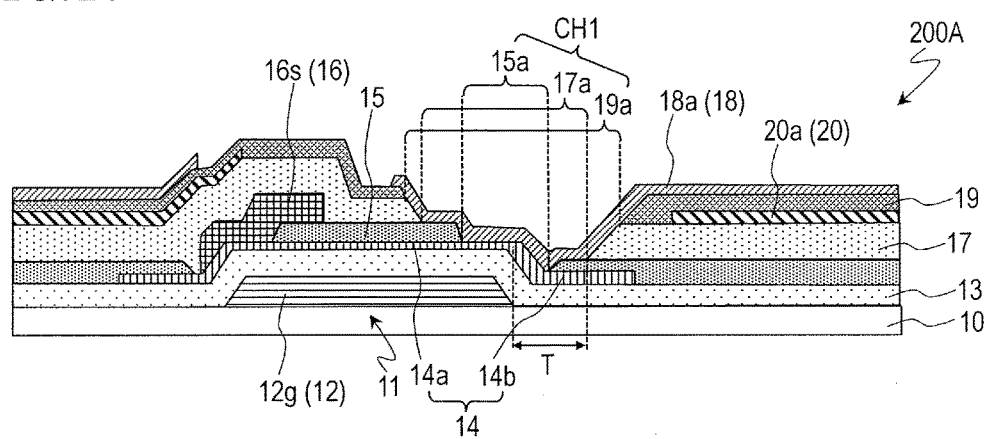
[FIG. 17] A cross-sectional view schematically showing a TFT substrate 200A that is a variation of the TFT substrate 200.

FIG. 17 shows a TFT substrate 200A that is a variation of the TFT substrate 200. FIG. 17 is a cross-sectional view schematically showing the TFT substrate 200A.

In the TFT substrate 200, as shown in FIG. 12, the fourth insulating layer (storage capacitance insulating layer) 19 covers the first transparent electrode layer 18, and the second transparent electrode layer 20 is provided on the fourth insulating layer 19. On the other hand, in the TFT substrate 200A, as shown in FIG. 17, the fourth insulating layer (storage capacitance insulating layer) 19 is provided between the third insulating layer (interlayer insulating layer) 17 and the first transparent electrode layer 18, and the second transparent electrode layer 20 that includes the common electrode 20a (a transparent electrode which is electrically separated from the pixel electrode 18a) is provided between the third insulating layer 17 and the fourth insulating layer 19. In the TFT substrate 200A, as shown in FIG. 17, the first contact hole CH1 is provided not only in the second insulating layer 15 and the third insulating layer 17 but also in the fourth insulating layer 19. That is, the first contact hole CH1 consists of the opening 15a of the second insulating layer 15, the opening 17a of the third insulating layer 17 and the opening 19a of the fourth insulating layer 19.

Also in the thus-configured TFT substrate 200A, the same effects can be achieved as those achieved by the TFT substrate 200.

Figure 18:
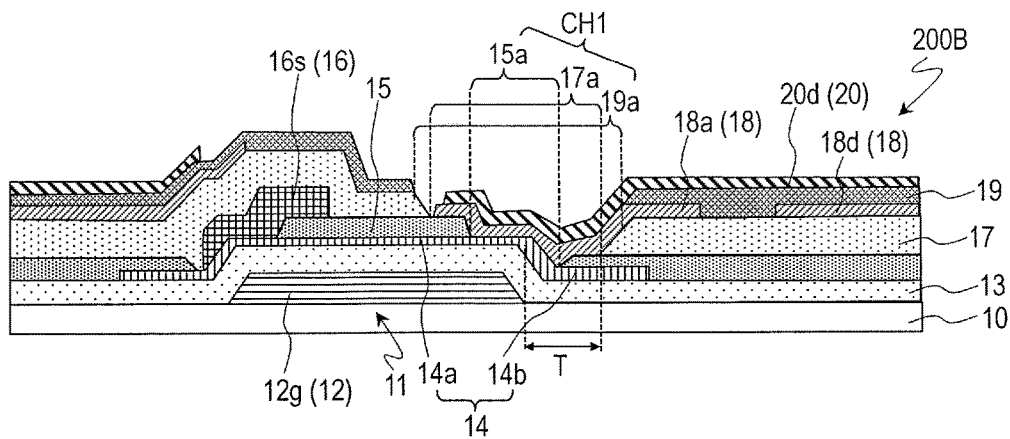
[FIG. 18] A cross-sectional view schematically showing a TFT substrate 200B that is another variation of the TFT substrate 200.

FIG. 18 shows a TFT substrate 200B that is a variation of the TFT substrate 200. FIG. 18 is a cross-sectional view schematically showing the TFT substrate 200B.

In the TFT substrate 200B, as shown in FIG. 18, the first contact hole CH1 is provided not only in the second insulating layer 15 and the third insulating layer 17 but also in the fourth insulating layer 19. That is, the first contact hole CH1 consists of the opening 15a of the second insulating layer 15, the opening 17a of the third insulating layer 17 and the opening 19a of the fourth insulating layer 19. The first transparent electrode layer 18 includes a first electrode 18d that is electrically separated from the transparent electrically-conductive layer 18a. The second transparent electrode layer 20 includes a second electrode 20d that is in contact with the transparent electrically-conductive layer 18a in the first contact hole CH1.

In the TFT substrate 200B, each of the pixels P includes a TFT 11, a first electrode 18d and a second electrode 20d. The first electrode 18d functions as a common electrode. The second electrode 20d functions as a pixel electrode.

When the TFT substrate 200B is used in a FFS mode liquid crystal display device, the pixel electrode 20d has at least one slit. Alternatively, the TFT substrate 200B may be used in a TN (Twisted Nematic) mode or VA (Vertical Alignment) mode liquid crystal display device.

Also in the thus-configured TFT substrate 200B, the same effects can be achieved as those achieved by the TFT substrates 200 and 200A.

Figure 19:
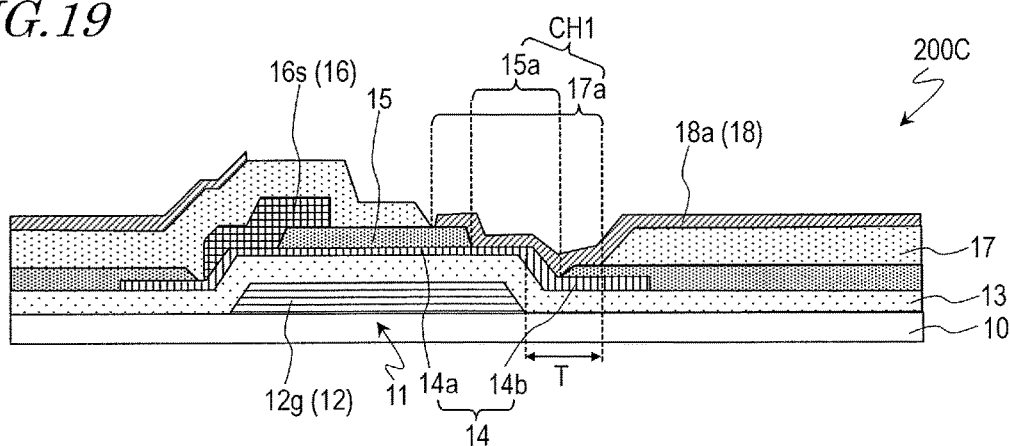
[FIG. 19] A cross-sectional view schematically showing a TFT substrate 200C that is still another variation of the TFT substrate 200.

FIG. 19 shows a TFT substrate 200C that is a variation of the TFT substrate 200. FIG. 19 is a cross-sectional view schematically showing the TFT substrate 200C.

The TFT substrate 200C has such a configuration that the fourth insulating layer 19 and the second transparent electrode layer 20 are omitted from the TFT substrate 200. Also in the thus-configured TFT substrate 200C, the same effects can be achieved as those achieved by the TFT substrates 200, 200A and 200B.

Embodiment 3

Figure 20:
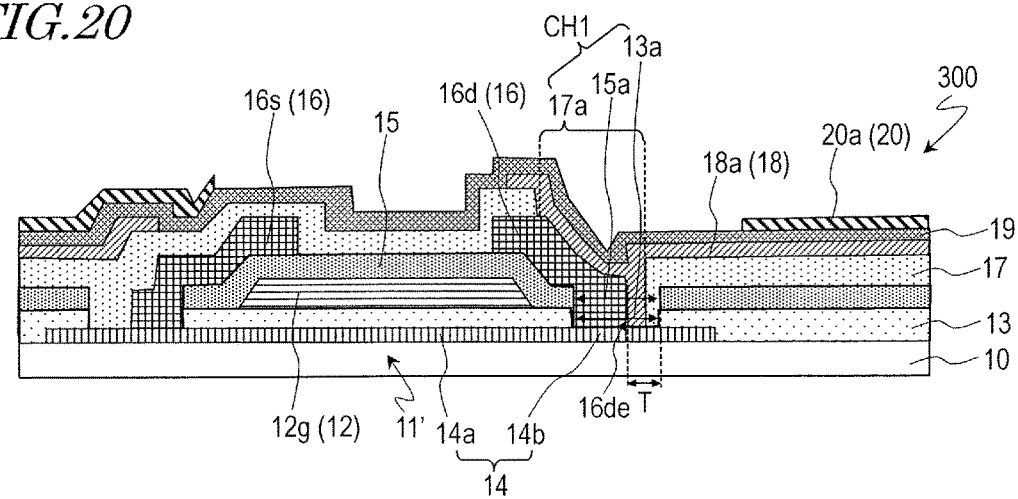
[FIG. 20] A cross-sectional view schematically showing a TFT substrate 300 of still another embodiment of the present invention.

FIG. 20 shows a TFT substrate 300 of the present embodiment. FIG. 20 is a cross-sectional view schematically showing the TFT substrate 300.

The TFT substrate 300 of the present embodiment includes a top gate type TFT 11', while the TFT substrates 100 and 200 of Embodiments 1 and 2 have a bottom gate type TFT 11.

The TFT substrate 300 includes a substrate 10 and a TFT 11' supported by the substrate 10 as shown in FIG. 20. The substrate 10 is an insulative transparent substrate (e.g., glass substrate). The TFT 11' includes a gate electrode 12g, a source electrode 16s and a drain electrode 16d.

Hereinafter, the configuration of the TFT substrate 300 is described more specifically. As shown in FIG. 20, the TFT substrate 300 includes an oxide semiconductor layer 14, a first insulating layer 13, a first metal layer 12, a second insulating layer 15, a second metal layer 16, a third insulating layer 17 and a first transparent electrode layer 18. The TFT substrate 300 further includes a fourth insulating layer 19 and a second transparent electrode layer 20.

The oxide semiconductor layer 14 is provided on the substrate 10. The oxide semiconductor layer 14 includes the active layer of the TFT 11'. The oxide semiconductor layer includes a first portion 14a lying above the gate electrode 12g and a second portion 14b extending from the first portion 14a so as to lie across an edge of the gate electrode 12g on the drain electrode 16d side.

The first insulating layer (gate insulating layer) 13 is provided on the oxide semiconductor layer 14. That is, the first insulating layer 13 is arranged so as to cover the oxide semiconductor layer 14. The first insulating layer 13 is made of an inorganic insulating material.

The first metal layer 12 is provided on the first insulating layer 13. The first metal layer 12 includes the gate electrode 12g of the TFT 11'. The first metal layer 12 may be a single-layer structure or may be a multilayer structure consisting of a plurality of layers. The first metal layer 12 includes at least a layer which is made of a metal material. When the first metal layer 12 is a multilayer structure, some layers may be made of a metal nitride or a metal oxide.

The second insulating layer (interlayer insulating layer) 15 is provided on the first metal layer 12. The second insulating layer 15 is made of an inorganic insulating material.

The second metal layer 16 is provided on the second insulating layer 15. The second metal layer 16 includes the source electrode 16s and the drain electrode 16d of the TFT 11'. The second metal layer 16 may be a single-layer structure or may be a multilayer structure consisting of a plurality of layers. The second metal layer 16 includes at least a layer which is made of a metal material. When the second metal layer 16 is a multilayer structure, some layers may be made of a metal nitride or a metal oxide. The first metal layer 12 and the second metal layer 16, which include a metal material layer, generally have higher electrical conductivities than an electrically-conductive layer which is made of a transparent electrically-conductive material. Therefore, the width of the wire can be reduced, and they can contribute to achievement of higher definition and improvement in pixel aperture ratio.

The third insulating layer (passivation layer) 17 is provided on the second metal layer 16. The third insulating layer 17 is made of an inorganic insulating material. That is, the third insulating layer 17 does not include an organic insulating layer.

The first insulating layer 13, the second insulating layer 15 and the third insulating layer 17 have a first contact hole CH1. The first contact hole CH1 consists of an opening 13a formed in the first insulating layer 13, an opening 15a formed in the second insulating layer 15 and an opening 17a formed in the third insulating layer 17. The first contact hole CH1 overlaps the second portion 14b of the oxide semiconductor layer 14 when viewed in the normal direction of the substrate 10. The first contact hole CH1 also overlaps an end portion 16de of the drain electrode 16d on the second portion 14b side when viewed in the normal direction of the substrate 10. That is, the first contact hole CH1 is formed such that the end portion 16de of the drain electrode 16d and the second portion 14b of the oxide semiconductor layer 14 are exposed.

The first transparent electrode layer 18 is provided on the third insulating layer 17. The first transparent electrode layer 18 is made of a transparent electrically-conductive material. The first transparent electrode layer 18 includes a transparent electrically-conductive layer 18a which is in contact with the second portion 14b of the oxide semiconductor layer 14 in the first contact hole CH1. The TFT 11' and the transparent electrically-conductive layer 18a are provided in each of the pixels P (i.e., each of the pixels P includes the TFT 11' and the transparent electrically-conductive layer 18a). The transparent electrically-conductive layer 18a functions as the pixel electrode.

The fourth insulating layer (storage capacitance insulating layer) 19 covers the first transparent electrode layer 18. The fourth insulating layer 19 is made of an inorganic insulating material.

The second transparent electrode layer 20 is provided on the fourth insulating layer 19. The second transparent electrode layer 20 includes a transparent electrode 20a which is electrically separated from the pixel electrode 18a. This transparent electrode 20a functions as the common electrode. The common electrode 20a opposes the pixel electrode 18a via the fourth insulating layer 19. The pixel electrode 18a, the common electrode 20a, and the fourth insulating layer 19 lying between the pixel electrode 18a and the common electrode 20a form storage capacitance. The common electrode 20a has at least one slit (not shown herein).

On the common electrode 20a, an unshown alignment film is provided. The TFT substrate 300 that has the above-described configuration is suitably used in FFS (Fringe Field Switching) mode liquid crystal display devices.

In the TFT substrate 300 of the present embodiment, as previously described, when viewed in the normal direction of the substrate 10, the first contact hole CH1 overlaps the end portion 16de of the drain electrode 16d on the second portion 14b side and the second portion 14b of the oxide semiconductor layer 14. Thus, part of the first contact hole CH1 can be a light transmissive region T in which none of the gate electrode 12g and the drain electrode 16d blocks light. Note that the interlayer insulating layer 17 of the TFT substrate 100 does not include an organic insulating layer, and therefore, the first contact hole CH1 is relatively shallow. Therefore, the disturbance in the liquid crystal alignment which is attributed to the first contact hole CH1 is small, and light leakage near the first contact hole CH1 is small. Thus, provision of the above-described light transmissive region T does not adversely affect displaying of images. As described herein, by utilizing part of the first contact hole CH1 as the light transmissive region T, the light utilization efficiency can be increased.

Figure 21:
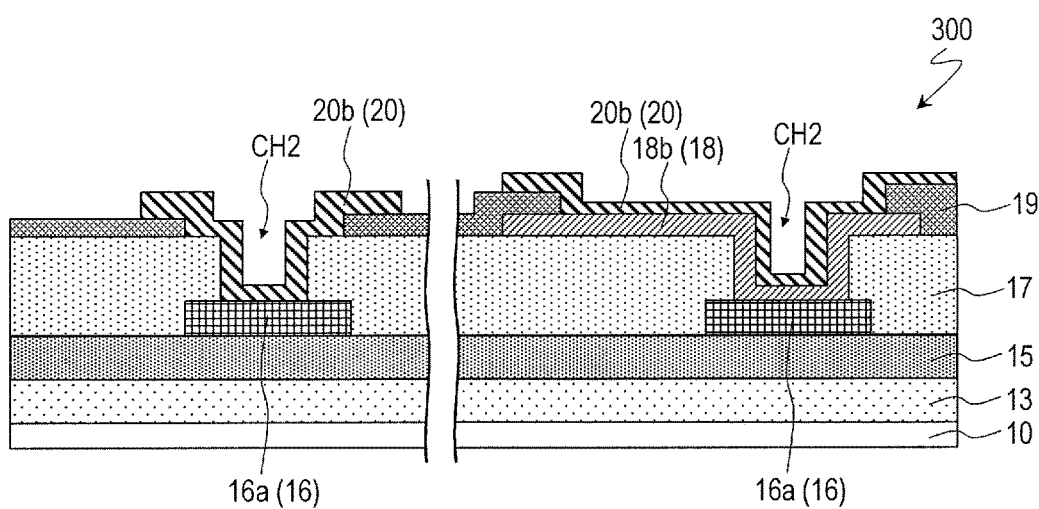
[FIG. 21] A cross-sectional view showing an example of a S-COM connecting portion of the TFT substrate 300.

Now, a specific configuration example of the S-COM connecting portion of the TFT substrate 300 is described with reference to FIG. 21. The left part of FIG. 21 shows an example of the cross-sectional configuration of the S-COM connecting portion. The right part of FIG. 21 shows another example of the cross-sectional configuration of the S-COM connecting portion.

In the configuration illustrated in FIG. 21, an upper wire layer 16a is provided on the second insulating layer 15. The upper wire layer 16a is formed by the same electrically-conductive film as the source electrode 16s and the drain electrode 16d. That is, the second metal layer 16 includes the upper wire layer 16a. The third insulating layer 17 and the fourth insulating layer 19 have a second contact hole CH2 which overlaps the upper wire layer 16a when viewed in the normal direction of the substrate 10.

In the configuration shown in the left part of FIG. 21, the second transparent electrode layer 20 further includes a transparent connecting layer 20b which is electrically coupled with the common electrode 20a. This transparent connecting layer 20b is in contact with the upper wire layer 16a in the second contact hole CH2. Therefore, in this configuration, the upper wire layer 16a and the common electrode 20a are electrically coupled with each other via the transparent connecting layer 20b.

In the configuration shown in the right part of FIG. 21, the first transparent electrode layer 18 further includes a first transparent connecting layer 18b which is electrically separated from the pixel electrode 18a. The second transparent electrode layer 20 further includes a second transparent connecting layer 20b which is electrically coupled with the common electrode 20a. The first transparent connecting layer 18b is in contact with the upper wire layer 16a in the second contact hole CH2. The second transparent connecting layer 20b is in contact with the first transparent connecting layer 18b in the second contact hole CH2. Therefore, in this configuration, the upper wire layer 16a and the common electrode 20a are electrically coupled with each other via the first transparent connecting layer 18b and the second transparent connecting layer 20b.

Figure 22:
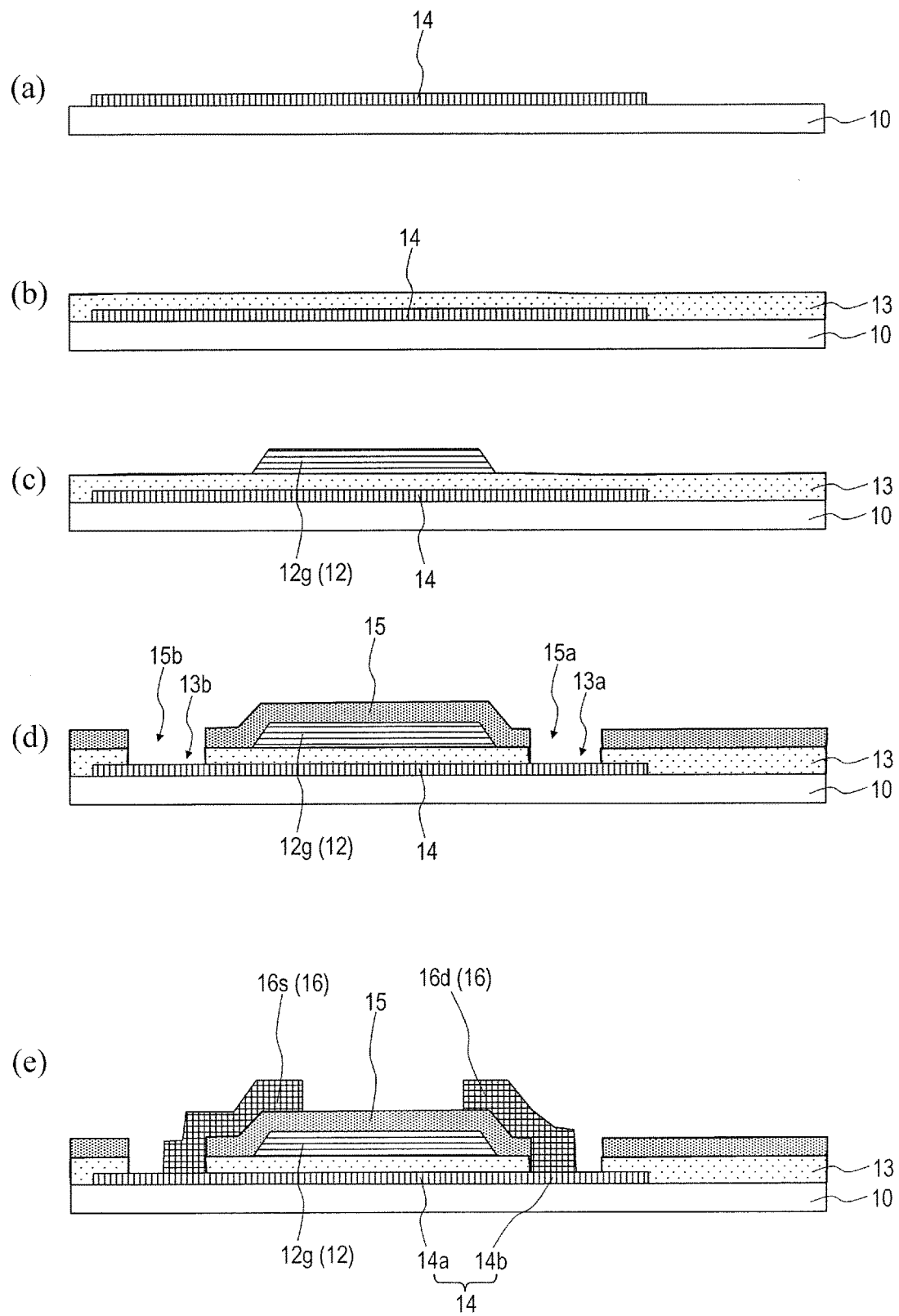
[FIG. 22] (a) to (e) are cross-sectional views of the steps for schematically illustrating a manufacture process of the TFT substrate 300.

Next, a manufacturing method of the TFT substrate 300 is described with reference to FIG. 22 and FIG. 23. FIGS. 22(a) to 14(e) and FIGS. 23(a) to 15(d) are cross-sectional views of the steps for schematically illustrating a manufacture process of the TFT substrate 300.

First, as shown in FIG. 22(a), an oxide semiconductor layer 14 is formed on a substrate 10. Specifically, after an oxide semiconductor film is deposited on the first insulating layer 13, the oxide semiconductor film is patterned, whereby the oxide semiconductor layer 14 in the shape of an island is formed. As the substrate 10, a quartz substrate, a glass substrate, a glass substrate covered with an insulative film, or the like, can be used. Here, a glass substrate covered with an insulative film is used as the substrate 10. Here, after an In—Ga—Zn—O based semiconductor film having a thickness of 20 nm to 200 nm is deposited, this semiconductor film is patterned through a photolithography process, whereby the oxide semiconductor layer 14 is formed.

Then, a first insulating layer (gate insulating layer) 13 is formed on the oxide semiconductor layer 14 as shown in FIG. 22(b). The first insulating layer 13 is, for example, a silicon oxide ($SiO_x$) film, a silicon nitride ($SiN_x$) film, a silicon oxynitride ($SiO_xN_y$, x>y) film, a silicon nitroxide ($SiN_xO_y$, x>y) film, an aluminum oxide film or a tantalum oxide film, or a multilayer film thereof. Here, a $SiO_2$ film having a thickness of 20 nm to 300 nm is deposited by, for example, CVD, whereby the first insulating layer 13 is formed.

Then, as shown in FIG. 22(c), a first metal layer 12 which includes a gate electrode 12g is formed on the first insulating layer 13. Specifically, after a first electrically-conductive film is deposited on the first insulating layer 13, the first electrically-conductive film is patterned, whereby the first metal layer 12 is formed. As the material of the first electrically-conductive film, for example, aluminum (Al), chromium (Cr), copper (Cu), tantalum (Ta), titanium (Ti), molybdenum (Mo) or tungsten (W), or an alloy thereof, can be used. The first electrically-conductive film may be a single-layer structure or may be a multilayer structure consisting of a plurality of layers. For example, a multilayer structure of Ti/Al/Ti (upper layer/middle layer/lower layer) or a multilayer structure of Mo/Al/Mo can be used. The multilayer structure of the first electrically-conductive film is not limited to a three-layer structure but may be a two-layer structure or a multilayer structure consisting of four or more layers. The first electrically-conductive film only needs to include at least a layer which is made of a metal material. When the first electrically-conductive film is a multilayer structure, some layers may be made of a metal nitride or a metal oxide. Here, after the first electrically-conductive film is formed by sequentially depositing a TaN layer having a thickness of 5 nm to 100 nm and a W layer having a thickness of 50 nm to 500 nm by, for example, sputtering, the first electrically-conductive film is patterned through a photolithography process, whereby the first metal layer 12 is formed.

Then, as shown in FIG. 22(d), a second insulating layer (interlayer insulating layer) 15 is formed on the first metal layer 12. In regions of the second insulating layer 15 corresponding to the drain and source regions of the oxide semiconductor layer 14, openings 15a and 15b are formed by patterning. In this patterning, opening 13a and 13b are also formed in regions of the first insulating layer 13 corresponding to the drain and source regions of the oxide semiconductor layer 14. That is, parts of the second insulating layer 15 and the first insulating layer 13 are removed such that parts of the oxide semiconductor 14 are exposed. The second insulating layer 15 is, for example, a silicon oxide ($SiO_x$) film, a silicon nitride ($SiN_x$) film, a silicon oxynitride ($SiO_xN_y$, x>y) film, a silicon nitroxide ($SiN_xO_y$, x>y) film, an aluminum oxide film or a tantalum oxide film, or a multilayer film thereof. Here, as the second insulating layer 15, a $SiO_2$ film having a thickness of 10 nm to 500 nm is deposited by, for example, CVD. On the $SiO_2$ film, a heat treatment is performed in air at 150° C. to 500° C. for 0.5 hour to 12 hours.

Then, as shown in FIG. 22(e), a second metal layer 16, which includes a source electrode 16s, a drain electrode 16d and an upper wire layer 16a, is formed on the oxide semiconductor layer 14 and the second insulating layer 15. Specifically, after a second electrically-conductive film is formed on the second insulating layer 15, the second electrically-conductive film is patterned, whereby the second metal layer 16 is formed. The patterning of the second electrically-conductive film is performed such that the source electrode 16s and the drain electrode 16d overlap end portions of the gate electrode 12g. As the material of the second electrically-conductive film, for example, aluminum (Al), chromium (Cr), copper (Cu), tantalum (Ta), titanium (Ti), molybdenum (Mo) or tungsten (W), or an alloy thereof, can be used. The second electrically-conductive film may be a single-layer structure or may be a multilayer structure consisting of a plurality of layers. For example, a multilayer structure of Ti/Al/Ti (upper layer/middle layer/lower layer) or a multilayer structure of Mo/Al/Mo can be used. The multilayer structure of the second electrically-conductive film is not limited to a three-layer structure but may be a two-layer structure or a multilayer structure consisting of four or more layers. The second electrically-conductive film only needs to include at least a layer which is made of a metal material. When the second electrically-conductive film is a multilayer structure, some layers may be made of a metal nitride or a metal oxide. Here, after the second electrically-conductive film is formed by sequentially depositing a Ti layer having a thickness of 10 nm to 100 nm, an Al layer having a thickness of 50 nm to 400 nm, and a Ti layer having a thickness of 50 nm to 300 nm by, for example, sputtering, the second electrically-conductive film is patterned through a photolithography process, whereby the second metal layer 16 is formed.

Then, as shown in FIG. 23(a), a third insulating layer (passivation layer) is formed on the second metal layer 16. The third insulating layer 17 formed in this step does not include an organic insulating layer. In a region of the third insulating layer 17 corresponding to the opening 15a of the second insulating layer 15 and the opening 13a of the first insulating layer 13, an opening 17a is formed by patterning. That is, part of the third insulating layer 17 is removed such that part of the drain electrode 16d and part of the oxide semiconductor layer 14 are exposed. In this patterning, an opening for electrical connection between the upper wire layer 16a and the transparent connecting layer 20b (see the left part of FIG. 21) or an opening for electrical connection between the upper wire layer 16a and the first transparent connecting layer 18b (see the right part of FIG. 21) is formed in the third insulating layer 17 of the S-COM connecting portion. The third insulating layer 17 is, for example, a silicon oxide ($SiO_x$) film, a silicon nitride ($SiN_x$) film, a silicon oxynitride ($SiO_xN_y$, x>y) film, a silicon nitroxide ($SiN_xO_y$, x>y) film, an aluminum oxide film or a tantalum oxide film, or a multilayer film thereof. Here, after a $SiO_2$ film having a thickness of 50 nm to 500 nm is deposited, a heat treatment is performed on the $SiO_2$ film in air at 200° C. to 400° C. for 0.5 hour to 4 hours. Thereafter, a $SiN_x$ film having a thickness of 50 nm to 500 nm is deposited. The resultant multilayer film is the third insulating layer 17.

In the present embodiment, the opening 13a of the first insulating layer 13, the opening 15a of the second insulating layer 15 and the opening 17a of the third insulating layer 17 constitute the first contact hole CH1 that overlaps the second portion 14b of the oxide semiconductor layer 14 and the end portion 16de of the drain electrode 16d when viewed in the normal direction of the substrate 10. That is, the first half of the process of forming the first contact hole CH1 in the first insulating layer 13, the second insulating layer 15 and the third insulating layer 17 (the step of forming the openings 13a and 15a in the first insulating layer 13 and the second insulating layer 15) is included in the step of forming the second insulating layer 15, and the second half (the step of forming the opening 17a in the third insulating layer 17) is included in the step of forming the third insulating layer 17.

Then, as shown in FIG. 23(b), a first transparent electrode layer 18 is formed on the third insulating layer 17. The first transparent electrode layer 18 includes a pixel electrode (transparent electrically-conductive layer) 18a. (When the S-COM connecting portion shown in the right part of FIG. 21 is provided, the first transparent electrode layer 18 further includes a first transparent connecting layer 18b.) Specifically, after a third electrically-conductive film is deposited on the third insulating layer 17, the third electrically-conductive film is patterned, whereby the first transparent electrode layer 18 is formed. The patterning is carried out such that the pixel electrode 18a is in contact with the drain electrode 16d and the second portion 14b of the oxide semiconductor layer 14 in the first contact hole CH1. As the material of the third electrically-conductive film, various transparent electrically-conductive materials can be used. For example, a metal oxide such as ITO, IZO or ZnO can be used. Here, after a third electrically-conductive film is formed by depositing a metal oxide film having a thickness of 20 nm to 300 nm by, for example, sputtering, the third electrically-conductive film is patterned through a photolithography process, whereby the first transparent electrode layer 18 is formed.

Figure 23:
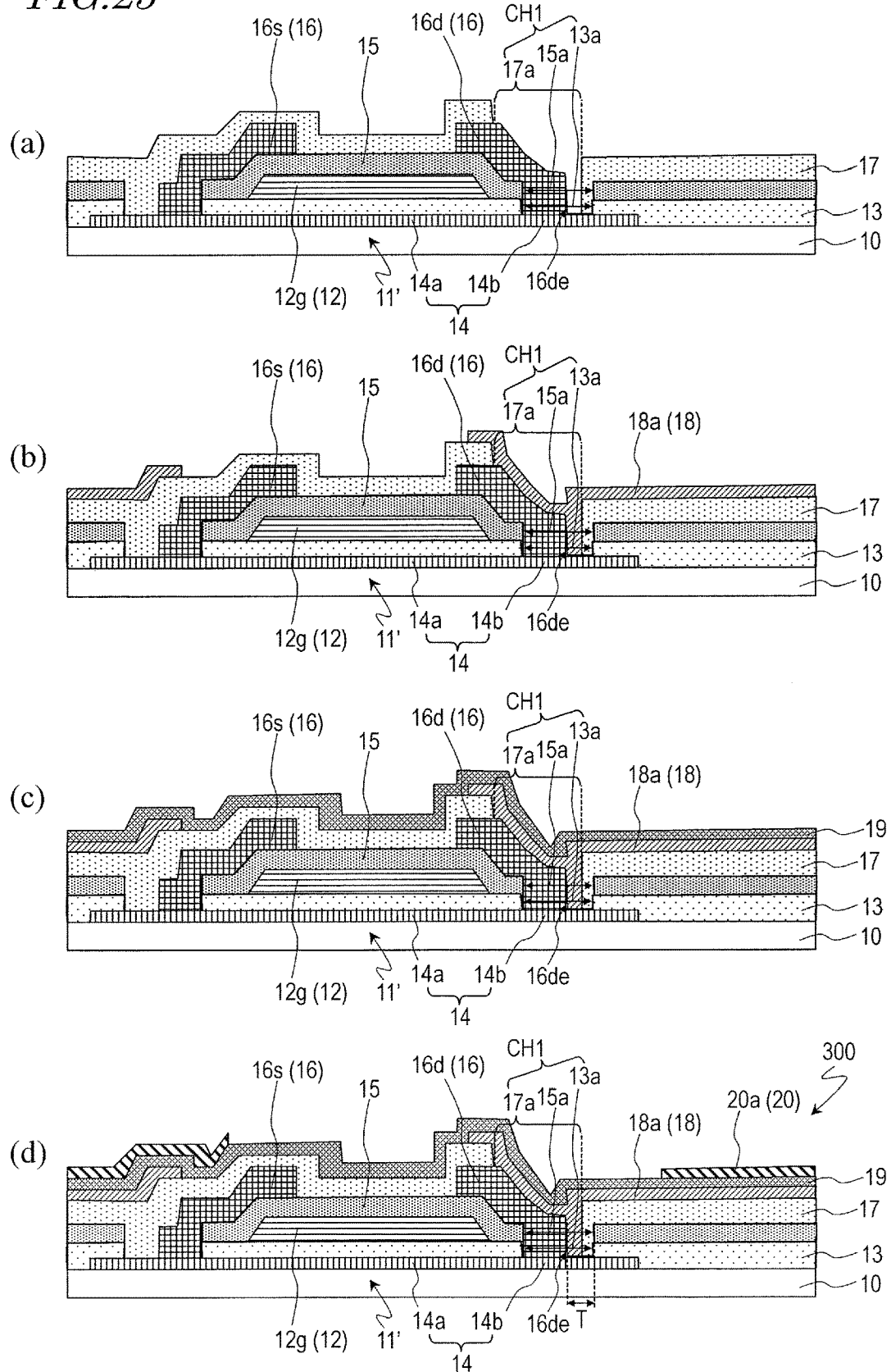
[FIG. 23] (a) to (d) are cross-sectional views of the steps for schematically illustrating a manufacture process of the TFT substrate 300.

Then, as shown in FIG. 23(*c*), a fourth insulating layer (storage capacitance insulating layer) 19 is formed on the first transparent electrode layer 18. In the fourth insulating layer 19 of the S-COM connecting portion, an opening for electrical connection between the upper wire layer 16*a* and the transparent connecting layer 20*b* (see the left part of FIG. 21) or an opening for electrical connection between the first transparent connecting layer 18*b* and the second transparent connecting layer 20*b* (see the right part of FIG. 21) is formed. The fourth insulating layer 19 is, for example, a silicon oxide ($SiO_x$) film, a silicon nitride ($SiN_x$) film, a silicon oxynitride ($SiO_xN_y$, x>y) film, a silicon nitroxide ($SiN_xO_y$, x>y) film, an aluminum oxide film or a tantalum oxide film, or a multilayer film thereof. Here, as the fourth insulating layer 19, a SiNX film having a thickness of 50 nm to 500 nm is deposited by, for example, CVD.

Thereafter, as shown in FIG. 23(*d*), a second transparent electrode layer 20 is formed on the fourth insulating layer 19. The second transparent electrode layer 20 includes a common electrode (transparent electrode) 20*a*. (When the S-COM connecting portion shown in the left part of FIG. 21 is provided, the second transparent electrode layer 20 further includes a transparent connecting layer 20*b*. When the S-COM connecting portion shown in the right part of FIG. is provided, the second transparent electrode layer 20 further includes a second transparent connecting layer 20*b*.) Specifically, after a fourth electrically-conductive film is deposited on the fourth insulating layer 19, the fourth electrically-conductive film is patterned, whereby the second transparent electrode layer 20 is formed. As the material of the fourth electrically-conductive film, various transparent electrically-conductive materials can be used. For example, a metal oxide such as ITO, IZO or ZnO can be used. Here, after a fourth electrically-conductive film is formed by depositing a metal oxide film having a thickness of 20 nm to 300 nm by, for example, sputtering, the fourth electrically-conductive film is patterned through a photolithography process, whereby the second transparent electrode layer 20 is formed.

In such a way, the TFT substrate 300 can be formed. The TFT substrate 300 is suitably used in liquid crystal display devices.

Next, a variation of the TFT substrate 300 of the present embodiment is described.

Figure 24:
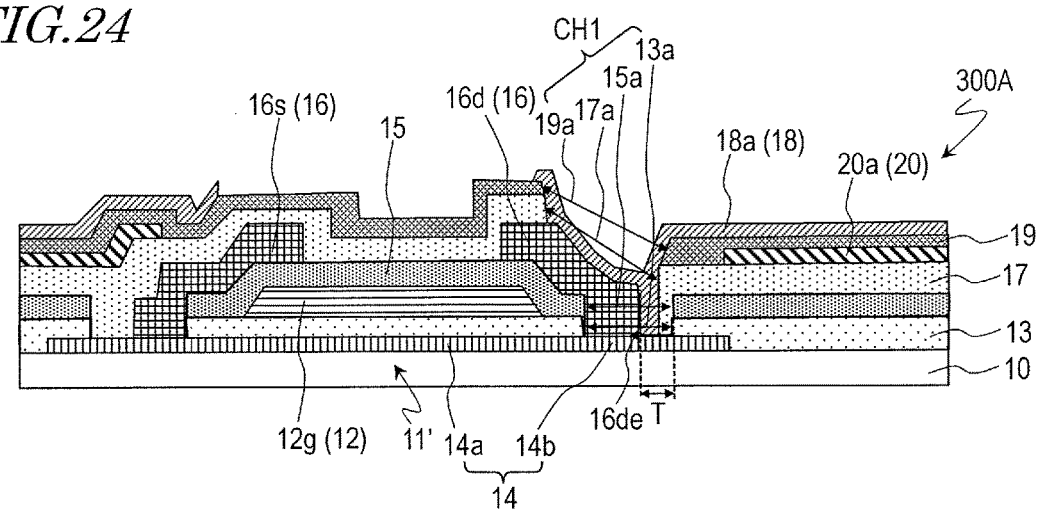
[FIG. 24] A cross-sectional view schematically showing a TFT substrate 300A that is a variation of the TFT substrate 300.

FIG. 24 shows a TFT substrate 300A that is a variation of the TFT substrate 300. FIG. 24 is a cross-sectional view schematically showing the TFT substrate 300A.

In the TFT substrate 300, as shown in FIG. 20, the fourth insulating layer (storage capacitance insulating layer) 19 covers the first transparent electrode layer 18, and the second transparent electrode layer 20 is provided on the fourth insulating layer 19. On the other hand, in the TFT substrate 300A, as shown in FIG. 24, the fourth insulating layer (storage capacitance insulating layer) 19 is provided between the third insulating layer (interlayer insulating layer) 17 and the first transparent electrode layer 18, and the second transparent electrode layer 20 that includes the common electrode 20*a* (a transparent electrode which is electrically separated from the pixel electrode 18*a*) is provided between the third insulating layer 17 and the fourth insulating layer 19. In the TFT substrate 300A, as shown in FIG. 24, the first contact hole CH1 is provided not only in the first insulating layer 13, the second insulating layer 15 and the third insulating layer 17 but also in the fourth insulating layer 19. That is, the first contact hole CH1 consists of the opening 13*a* of the first insulating layer 13, the opening 15*a* of the second insulating layer 15, the opening 17*a* of the third insulating layer 17 and the opening 19*a* of the fourth insulating layer 19.

Also in the thus-configured TFT substrate 300A, the same effects can be achieved as those achieved by the TFT substrate 300.

Figure 25:
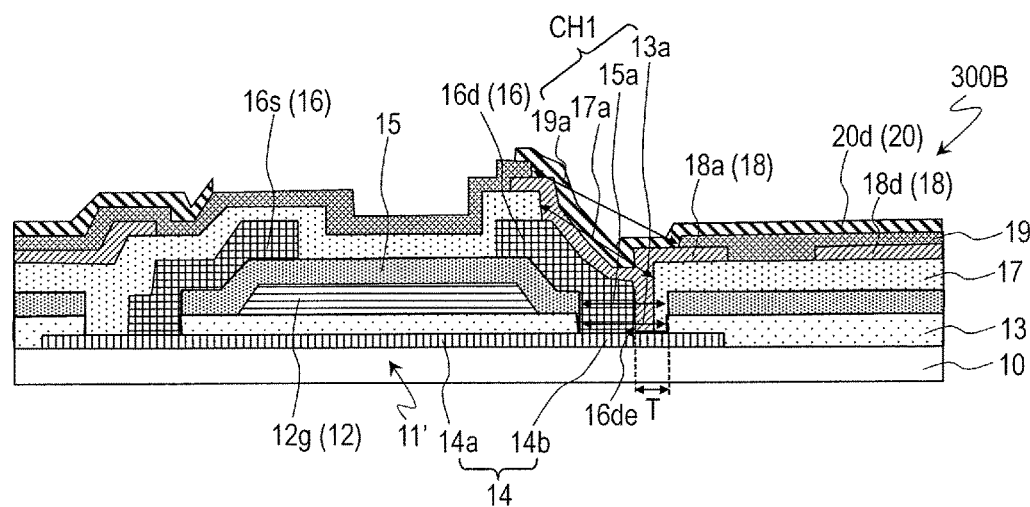
[FIG. 25] A cross-sectional view schematically showing a TFT substrate 300B that is another variation of the TFT substrate 300.

FIG. 25 shows a TFT substrate 300B that is a variation of the TFT substrate 300. FIG. 25 is a cross-sectional view schematically showing the TFT substrate 300B.

In the TFT substrate 300B, as shown in FIG. 25, the first contact hole CH1 is provided not only in the first insulating layer 13, the second insulating layer 15 and the third insulating layer 17 but also in the fourth insulating layer 19. That is, the first contact hole CH1 consists of the opening 13*a* of the first insulating layer 13, the opening 15*a* of the second insulating layer 15, the opening 17*a* of the third insulating layer 17 and the opening 19*a* of the fourth insulating layer 19. The first transparent electrode layer includes a first electrode 18*d* that is electrically separated from the transparent electrically-conductive layer 18*a*. The second transparent electrode layer 20 includes a second electrode 20*d* that is in contact with the transparent electrically-conductive layer 18*a* in the first contact hole CH1.

In the TFT substrate 300B, each of the pixels P includes a TFT 11, a first electrode 18*d* and a second electrode 20*d*. The first electrode 18*d* functions as a common electrode. The second electrode 20*d* functions as a pixel electrode.

When the TFT substrate 300B is used in a FFS mode liquid crystal display device, the pixel electrode 20*d* has at least one slit. Alternatively, the TFT substrate 300B may be used in a TN (Twisted Nematic) mode or VA (Vertical Alignment) mode liquid crystal display device.

Also in the thus-configured TFT substrate 300B, the same effects can be achieved as those achieved by the TFT substrates 300 and 300A.

Figure 26:
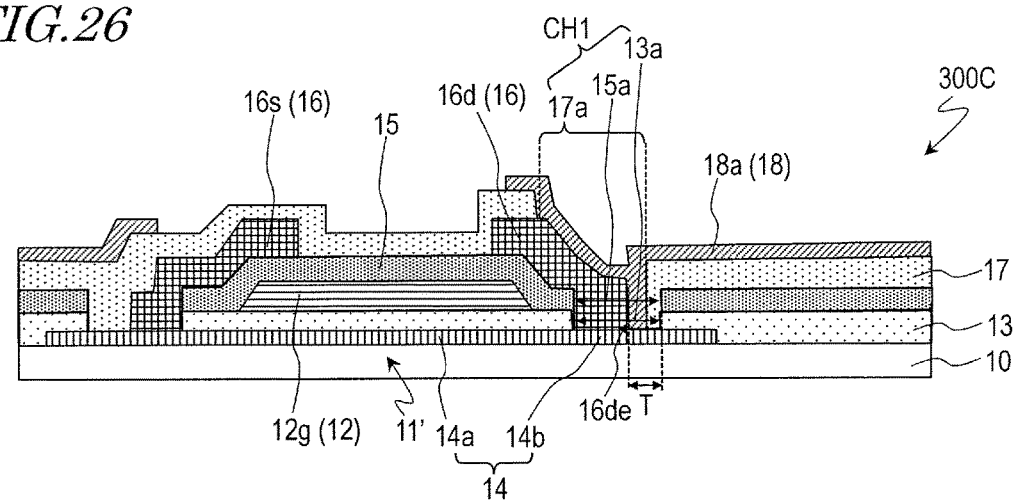
[FIG. 26] A cross-sectional view schematically showing a TFT substrate 300C that is still another variation of the TFT substrate 300.

FIG. 26 shows a TFT substrate 300C that is a variation of the TFT substrate 300. FIG. 26 is a cross-sectional view schematically showing the TFT substrate 300C.

The TFT substrate 300C has such a configuration that the fourth insulating layer 19 and the second transparent electrode layer 20 are omitted from the TFT substrate 300. Also in the thus-configured TFT substrate 300C, the same effects can be achieved as those achieved by the TFT substrates 300, 300A and 300B.

Embodiment 4

Figure 27:
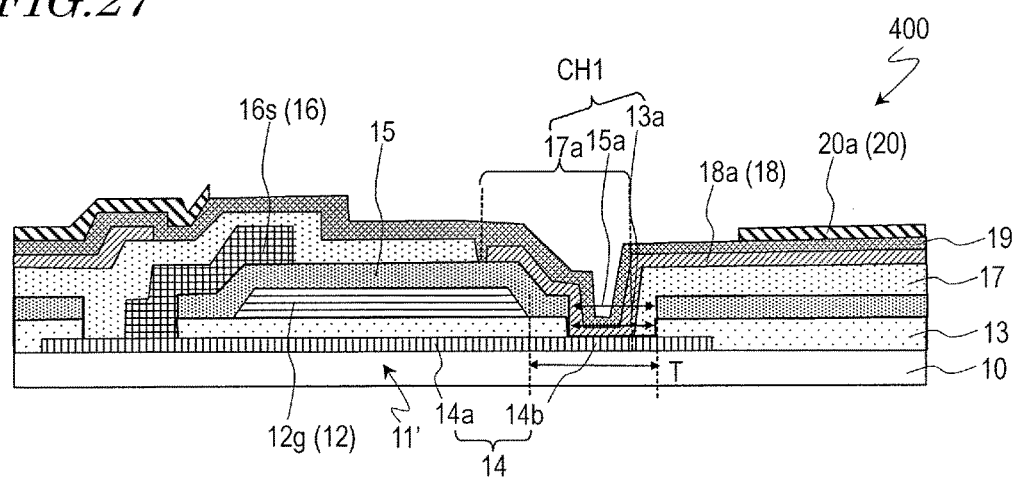
[FIG. 27] A cross-sectional view schematically showing a TFT substrate 400 of still another embodiment of the present invention.

FIG. 27 shows a TFT substrate 400 of the present embodiment. FIG. 27 is a cross-sectional view schematically showing the TFT substrate 400. Note that, in the following description, the description is focused on the differences of the TFT substrate 400 from the TFT substrate 300 of Embodiment 3.

As shown in FIG. 27, the TFT substrate 400 is different from the TFT substrate 300 of Embodiment 3 in that the second metal layer 16 does not include the drain electrode of the TFT 11. In the TFT substrate 400, part of the first transparent electrode layer 18 which is in contact with the second portion 14*b* of the oxide semiconductor layer 14 functions as the drain electrode of the TFT 11. Note that part of the first transparent electrode layer 18 (which functions as the drain electrode) preferably overlaps the gate electrode 12g when viewed in the normal direction of the substrate 10 as shown in FIG. 27.

Also in the TFT substrate 400 of the present embodiment, the first contact hole CH1 overlaps the second portion 14b of the oxide semiconductor layer 14 when viewed in the normal direction of the substrate 10. Therefore, part of the first contact hole CH1 can be a light transmissive region T which is not shielded from light by the gate electrode 12g. Thus, the light utilization efficiency can be increased.

Since in the TFT substrate 400 of the present embodiment the second metal layer 16 does not include the drain electrode 16d, the effect of improving the contrast ratio is achieved. When the second metal layer 16 does not include the drain electrode 16d, the step at the end portion 16de of the drain electrode 16d (see, for example, FIG. 20) does not exist, so that the disturbance in the alignment of the liquid crystal which is attributed to this step is reduced. Thus, light leakage at the time of black display is suppressed, so that the contrast ratio improves.

INDUSTRIAL APPLICABILITY

According to an embodiment of the present invention, a semiconductor device in which decrease of the light utilization efficiency is suppressed than in conventional semiconductor devices and a manufacturing method of the semiconductor device are provided. The semiconductor device of an embodiment of the present invention is suitably used as an active matrix substrate in various display devices.

REFERENCE SIGNS LIST 10 substrate
11, 11' thin film transistor (TFT)
12 first metal layer
12a lower wire layer
12g gate electrode
13 first insulating layer
13a, 13b opening of first insulating layer
14 oxide semiconductor layer
14a first portion of oxide semiconductor layer
14b second portion of oxide semiconductor layer
15 second insulating layer
15a, 15b opening of second insulating layer
16 second metal layer
16a upper wire layer
16d drain electrode
16de end portion of drain electrode on second portion side
16s source electrode
17 third insulating layer
17a opening of third insulating layer
18 first transparent electrode layer
18a transparent electrically-conductive layer
18b first transparent connecting layer
18c third transparent connecting layer
18d first electrode
19 fourth insulating layer
19a opening of fourth insulating layer
20 second transparent electrode layer
20a transparent electrode
20b transparent connecting layer, second transparent connecting layer
20c fourth transparent connecting layer
20d second electrode
30 substrate
31 color filter layer
32 shield layer (black matrix)
100, 100A, 100B, 100C TFT substrate (active matrix substrate)
200, 200A, 200B, 200C TFT substrate (active matrix substrate)
300, 300A, 300B, 300C TFT substrate (active matrix substrate)
400 TFT substrate (active matrix substrate)
110, 210 counter substrate (color filter substrate)
120, 220 liquid crystal layer
1000, 1100 liquid crystal display device
P pixel
G gate wire
S source wire
CH1 first contact hole
CH2 second contact hole
CH3 third contact hole
DR display region (active region)
FR peripheral region (frame region)
FRa terminal section
T light transmissive region

The invention claimed is:

1. A semiconductor device including a substrate and a thin film transistor supported by the substrate, the thin film transistor including a gate electrode, a source electrode and a drain electrode, the semiconductor device comprising:
a first metal layer including the gate electrode of the thin film transistor;
a first insulating layer provided on the first metal layer;
an oxide semiconductor layer provided on the first insulating layer, the oxide semiconductor layer including an active layer of the thin film transistor;
a second insulating layer provided on the oxide semiconductor layer, the second insulating layer including a portion covering a channel region of the oxide semiconductor layer;
a second metal layer provided on the oxide semiconductor layer and the second insulating layer, the second metal layer including at least the source electrode;
a third insulating layer provided on the second metal layer; and
a first transparent electrode layer provided on the third insulating layer,
wherein the oxide semiconductor layer includes a first portion lying above the gate electrode and a second portion extending from the first portion so as to lie across an edge of the gate electrode on the drain electrode side,
the third insulating layer does not include an organic insulating layer,
the second insulating layer and the third insulating layer have a first contact hole which overlaps the second portion of the oxide semiconductor layer when viewed in a normal direction of the substrate, and
the first transparent electrode layer includes a transparent electrically-conductive layer which is in contact with the second portion of the oxide semiconductor layer in the first contact hole.

2. The semiconductor device of claim 1, wherein
the second metal layer further includes the drain electrode, and
the first contact hole also overlaps an end portion of the drain electrode on the second portion side when viewed in the normal direction of the substrate.

3. The semiconductor device of claim 1, wherein the second metal layer does not include the drain electrode.

4. The semiconductor device of claim 1, wherein
the semiconductor device includes a plurality of pixels,
each of the plurality of pixels includes the thin film transistor and the transparent electrically-conductive layer, and
the transparent electrically-conductive layer functions as a pixel electrode.

5. The semiconductor device of claim 4, further comprising:
a fourth insulating layer covering the first transparent electrode layer; and
a second transparent electrode layer provided on the fourth insulating layer,
wherein the second transparent electrode layer includes a transparent electrode which is electrically separated from the pixel electrode, the transparent electrode being capable of functioning as a common electrode.

6. The semiconductor device of claim 5, wherein
the second metal layer further includes an upper wire layer,
the third insulating layer and the fourth insulating layer have a second contact hole which overlaps the upper wire layer when viewed in the normal direction of the substrate,
the second transparent electrode layer further includes a transparent connecting layer which is electrically coupled with the common electrode, and
the transparent connecting layer is in contact with the upper wire layer in the second contact hole.

7. The semiconductor device of claim 5, wherein
the second metal layer includes an upper wire layer,
the third insulating layer and the fourth insulating layer have a second contact hole which overlaps the upper wire layer when viewed in the normal direction of the substrate,
the first transparent electrode layer further includes a first transparent connecting layer which is electrically separated from the pixel electrode,
the second transparent electrode layer further includes a second transparent connecting layer which is electrically coupled with the common electrode,
the first transparent connecting layer is in contact with the upper wire layer in the second contact hole, and
the second transparent connecting layer is in contact with the first transparent connecting layer in the second contact hole.

8. The semiconductor device of claim 4, further comprising:
a fourth insulating layer provided between the third insulating layer and the first transparent electrode layer, and
a second transparent electrode layer provided between the third insulating layer and the fourth insulating layer,
wherein the first contact hole is provided also in the fourth insulating layer, and
the second transparent electrode layer includes a transparent electrode which is electrically separated from the pixel electrode, the transparent electrode being capable of functioning as a common electrode.

9. The semiconductor device of claim 1, further comprising:
a fourth insulating layer provided on the first transparent electrode layer; and
a second transparent electrode layer provided on the fourth insulating layer,
wherein the first contact hole is also provided in the fourth insulating layer,
the first transparent electrode layer further includes a first electrode which is electrically separated from the transparent electrically-conductive layer, and
the second transparent electrode layer includes a second electrode which is in contact with the transparent electrically-conductive layer in the first contact hole.

10. The semiconductor device of claim 9, wherein
the semiconductor device includes a plurality of pixels,
each of the plurality of pixels includes the thin film transistor, the first electrode and the second electrode,
the first electrode functions as a common electrode, and
the second electrode functions as a pixel electrode.

11. The semiconductor device of claim 1, wherein the oxide semiconductor layer includes an In—Ga—Zn—O based semiconductor.

12. The semiconductor device of claim 11, wherein the In—Ga—Zn—O based semiconductor includes a crystalline portion.

13. A liquid crystal display device, comprising:
an active matrix substrate;
a counter substrate which opposes the active matrix substrate; and
a liquid crystal layer provided between the active matrix substrate and the counter substrate,
wherein the active matrix substrate is the semiconductor device as set forth in claim 1.

14. A manufacturing method of a semiconductor device, the semiconductor device including a substrate and a thin film transistor supported by the substrate, the thin film transistor including a gate electrode, a source electrode and a drain electrode, the method comprising the steps of:
(a) forming a first metal layer on the substrate, the first metal layer including the gate electrode of the thin film transistor;
(b) forming a first insulating layer on the first metal layer;
(c) forming an oxide semiconductor layer on the first insulating layer;
(d) forming a second insulating layer on the oxide semiconductor layer, the second insulating layer including a portion covering a channel region of the oxide semiconductor layer;
(e) forming a second metal layer on the oxide semiconductor layer and the second insulating layer, the second metal layer including at least the source electrode;
(f) forming a third insulating layer on the second metal layer;
(g) forming a contact hole in the second insulating layer and the third insulating layer; and
(h) after step (g), forming a transparent electrode layer on the third insulating layer,
wherein the oxide semiconductor layer formed in step (c) includes a first portion lying above the gate electrode and a second portion extending from the first portion so as to lie across an edge of the gate electrode on the drain electrode side,
the third insulating layer formed in step (f) does not include an organic insulating layer,
the contact hole formed in step (g) overlaps the second portion of the oxide semiconductor layer when viewed in a normal direction of the substrate, and
the transparent electrode layer formed in step (h) includes a transparent electrically-conductive layer which is in contact with the second portion of the oxide semiconductor layer in the contact hole.

15. The manufacturing method of claim 14, wherein
the second metal layer formed in step (e) further includes the drain electrode, and the contact hole formed in step (g) also overlaps an end portion of the drain electrode on the second portion side when viewed in the normal direction of the substrate.

16. The manufacturing method of claim 14, wherein the second metal layer formed in step (e) does not include the drain electrode.

17. The manufacturing method of claim 14, wherein the oxide semiconductor layer includes an In—Ga—Zn—O based semiconductor.

18. The manufacturing method of claim 17, wherein the In—Ga—Zn—O based semiconductor includes a crystalline portion.

* * * * *